US006652658B1

United States Patent
Mori et al.

(10) Patent No.: US 6,652,658 B1
(45) Date of Patent: Nov. 25, 2003

(54) METHOD FOR MACHINING/CLEANING BY HYDROXIDE ION IN ULTRAPURE WATER

(75) Inventors: Yuzo Mori, Katano (JP); Toshio Ishikawa, Nara (JP)

(73) Assignee: Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 09/856,458
(22) PCT Filed: Dec. 7, 1999
(86) PCT No.: PCT/JP99/06829
§ 371 (c)(1),
(2), (4) Date: Jun. 6, 2001
(87) PCT Pub. No.: WO00/34995
PCT Pub. Date: Jun. 15, 2000

(30) Foreign Application Priority Data

Dec. 7, 1998 (JP) .......................... H10-347598
Dec. 7, 1998 (JP) .......................... H10-347599

(51) Int. Cl.$^7$ ................................. B08B 7/02
(52) U.S. Cl. ....................... 134/1; 134/1; 134/1.3; 134/10; 134/17; 134/34; 134/42; 134/902; 438/906; 216/93; 204/212; 204/224 M; 204/275.1; 205/640; 205/650; 205/652; 205/672
(58) Field of Search .................. 134/1, 1.3, 10, 134/17, 34, 42, 902; 438/906; 216/93; 204/212, 224 M, 275.1; 205/640, 650, 652, 672

(56) References Cited

U.S. PATENT DOCUMENTS 4,599,154 A 7/1986 Bender et al.
6,003,527 A * 12/1999 Netsu et al. ............... 134/1.3

FOREIGN PATENT DOCUMENTS

| EP | 0 194 734 A1 | 9/1986 |
| JP | 58165923 | * 10/1983 |
| JP | 61-214584 | 9/1986 |
| JP | 63-306630 | 12/1988 |
| JP | 2-54800 | 2/1990 |
| JP | 9-36079 | 2/1997 |
| KR | 97-8390 | 2/1997 |

* cited by examiner

Primary Examiner—Alexander Markoff
Assistant Examiner—M. Kornakov
(74) Attorney, Agent, or Firm—Armstrong, Westerman & Hattori, LLP

(57) ABSTRACT

A method for clean processing wherein an object and a high pressure nozzle are disposed a specific distance apart from each other inside a washing tank containing only ultra-pure water, an ion exchange material or catalyst material that increases the amount of hydroxide ions is provided between the processing surface of said workpiece and the distal end of the high pressure nozzle facing said surface, a voltage is applied using the high pressure nozzle as the cathode and the object as the anode and the hydroxide ions produced from the ultra-pure water are supplied to the surface of the object.

16 Claims, 17 Drawing Sheets

(a)  (b)

(a)

(b)

(a)

(b)

(a)

(b)

(a)

(b)

(c)

METHOD FOR MACHINING/CLEANING BY HYDROXIDE ION IN ULTRAPURE WATER

BACKGROUND OF THE INVENTION

1. Field of the Invention

The first invention relates to a method for processing with hydroxide ions in ultra-pure water, and more particularly relates to a processing method with which a workpiece can be subjected to removal processing or to oxide film formation processing by using only ultra-pure water and increasing the ion product is to provide a thereof. The second invention relates to a method for washing with hydroxide ions in ultra-pure water, with which hydroxide ions are supplied near the surface of a material to be washed, and particularly a semiconductor wafer or the like, and a high-speed shear flow of ultra-pure water is created, which makes it possible to completely remove any fine impurity metals adhering to the surface of the material being washed.

2. Description of the Related Art

Progress in scientific technology in recent years has led to new materials being developed one after the other, but an effective means of processing these new materials has yet to be established, with such technology always seeming to lag behind the development of new materials.

Recently, as the elements that make up all kinds of devices have become smaller and more precise, and as manufacturing on the sub-micron level has become more commonplace, the processing method itself increasingly has an effect on the characteristics of the material. In this situation, with a processing method in which part of the workpiece is physically and destructively removed with a tool, as with conventional mechanical processing, this processing can give rise to numerous defects in the workpiece, as a result of which the characteristics of the workpiece may suffer. A matter of great importance is therefore how to perform such processing without sacrificing the characteristics of the material.

Chemical polishing, electrolytic working, and electrolytic polishing are some of the special processing methods that have been developed as a means for solving the above problem. Unlike with conventional mechanical processing, these processing methods involve removing material by bringing about a chemical elution reaction. Therefore, defects such as work modified layers or dislocation due to plastic deformation do not occur, allowing processing to be carried out without the characteristics of the material being sacrificed as mentioned above.

A type of processing method that has been attracting even more attention involves the use of chemical interaction between atoms. This makes use of microparticles, radicals and so forth with high chemical reactivity. These processing methods remove material through a chemical reaction with the workpiece on the atomic order, so the processing can be controlled on the atomic order. Examples of these processing methods developed by the inventor include EEM (Elastic Emission Machining; Japanese Laid-Open Patent Application H1-236939) and plasma CVM (Chemical Vaporization Machining; Japanese Laid-Open Patent Application H1-125829). EEM makes use of a chemical reaction between microparticles and the workpiece, and therefore affords processing on the atomic order without sacrificing the characteristics of the material. Plasma CVM makes use of a radical reaction between the workpiece and radicals produced in a plasma at atmospheric pressure, and also affords processing on the atomic order.

With the above-mentioned electrolytic processing or electrolytic polishing, it has been conventionally held that the processing proceeds through electrochemical interaction between the workpiece and the electrolyte (an aqueous solution of NaCl, $NaNO_3$, HF, HCl, $HNO_3$, NaOH, or the like). Also, as long as electrolyte is used, the workpiece will inevitably be contaminated by the electrolyte.

In view of this, the inventor thought that hydroxide ions ($OH^-$) might be acting on the processing in neutral and alkaline electrolyte, and reached the conclusion that if this were true then processing would even be possible with water in which hydroxide ions were present in even a tiny amount. The possibility of such processing was also confirmed experimentally, and in Japanese Laid-Open Patent Application H10-58236 the inventor proposed a processing method in which only ultra-pure water from which as much of the trace impurities as possible have been removed is used, this is subjected to a ion product increasing treatment for increasing the hydroxide ion, a workpiece is immersed in this ultra-pure water with elevated hydroxide ion concentration, and removal processing or oxide film formation processing is performed through a chemical elution reaction or oxidation reaction involving these hydroxide ions. In addition, the inventor proposed to utilize an electrochemical interaction on a solid surface having a function of an ion exchange or a catalyst as a hydroxide ion increasing treatment. This created a novel processing method with which the hydroxide ions in ultra-pure water can be utilized to perform clean processing, without any impurities being left behind on the processing surface. This processing method is expected to find application in a very wide range of fields, including the manufacture of semiconductors.

Nevertheless, it is a known fact that the hydroxide ion concentration is extremely low in ultra-pure water, being only about $10^{-7}$ mol/L at 25° C. and 1 atm, and even if the hydroxide ion density is increased with an ion exchange film, the increase is still only by a factor of about $10^3$ to $10^4$ at most. This represents an ion density of $1/10^4$ to $1/10^3$ for 1 mol/L (1N) NaOH, and the processing rate is still too low for practical processing purposes.

Meanwhile, washing methods for removing fine impurity metals that adhere to the surface of the material being washed include chemical washing and physical washing. In particular, since electronic circuits are formed on the surface of a semiconductor wafer in a fine pattern on the sub-micron order, any metal contaminants on the surface thereof can have a tremendous effect on the performance of the device, and also lower the yield and hamper cost reduction efforts. Accordingly, a variety of washing methods have been proposed and put to practical use.

Typical examples of chemical washing include washing with an acid or hydrogen fluoride, and fluorocarbon washing, which has become problematic because it leads to depletion of the ozone layer. Typical examples of physical washing include ultrasonic washing in ultra-pure water, and a method in which adhering microparticles are contracted and expanded by cooling or heating the washed material so as to strip them from the surface of the material.

It is not easy, however, to remove impurity metals or impurity metals in an ionic state firmly adhering through interaction (a type of chemical bonding) at the interface of the washed material, without damaging the surface of the material, and conventional washing methods cannot be considered effective. Specifically, the surface of the washed material is corroded by the washing liquid with chemical washing, while physical washing scratches the surface of the washed material. Also, once foreign matter has been removed from the surface of the washed material, it can re-adhere to the same surface, which is extremely difficult to avoid.

In order to eliminate impurity metals adhering through chemical bonding to the surface of a washed material, the inventor predicted theoretically and confirmed through experimentation that a shear flow of at least a specific strength is required on the washed material surface, that is, that the shear flow must have at least a specific velocity gradient, and discovered that it is effective to concurrently use a chemical elution reaction between impurity metals and hydroxide ions in ultra-pure water. As mentioned above, though, the hydroxide ion concentration in ultra-pure water is extremely low, so low that a practical washing efficiency cannot be achieved.

In this prior art situation, the inventor solved all of these problems and perfected the present invention upon recognizing that the removal processing of a material and washing to remove substances firmly bonded or adhering to a material surface are both the same problem.

SUMMARY OF THE INVENTION

Specifically, the first object of the present invention is to provide a truly ideal and practical method for processing with hydroxide ions in ultra-pure water, in which the hydroxide ion density is further increased at the processing surface of a workpiece and any atoms of the workpiece that have bonded with hydroxide ions are quickly removed from the processing surface, which raises the processing rate and allows clean processing to be performed, without any impurities being left behind on the processing surface of the workpiece, using the hydroxide ions in ultra-pure water.

In view of this, to achieve the stated first object, the first invention is a method for processing with hydroxide ions in ultra-pure water, comprising the steps of disposing a workpiece and a high pressure nozzle a specific distance apart from each other inside a washing tank containing only ultra-pure water, providing an ion exchange material or catalyst material that increases the amount of hydroxide ions between the processing surface of said workpiece and the distal end of the high pressure nozzle facing said surface;

applying a voltage using the high pressure nozzle as the cathode and the workpiece as the anode, generating a high-speed shear flow of ultra-pure water sprayed from the high pressure nozzle near the surface of the workpiece, supplying hydroxide ions produced from the ultra-pure water to the workpiece surface, and subjecting the workpiece to removal processing or to oxide film formation processing by means of a chemical elution reaction or oxidation reaction brought about by the hydroxide ions.

If the spray opening in the high pressure nozzle is a round hole here, then spot processing can be performed, allowing the workpiece surface to be processed in any form desired, and if the spray opening in the high pressure nozzle is a slit, line processing can be performed, allowing the workpiece surface to be processed into a flat shape, undulating shape, or cylindrical shape over a large surface area. Also, it is preferable if a recovery means is provided on the downstream side of the high-speed shear flow generated by the high pressure nozzle, and any process reaction substances removed from the workpiece are recovered, because the removed processing reaction substances can be prevented from adhering to the workpiece surface.

With a method for processing with hydroxide ions in ultra-pure water as in the first invention described above, hydroxide ions are produced by an ion exchange material, and these are efficiently supplied to the workpiece surface by an electrical field and the flow of ultra-pure water sprayed from the high pressure nozzle, the result of which is that the density of hydroxide ions is higher near the workpiece surface. Also, any processing reaction substances produced in the reaction between the hydroxide ions and the workpiece atoms are immediately removed from this surface by a high-speed shear flow of ultra-pure water, so that a fresh processing surface is always exposed, and this markedly speeds up the processing. Furthermore, the processing apparatus can be more compact because a specific flow is produced only in the required area by the high pressure nozzle, and since processing is possible at an adequately large gap, it is extremely easy to control the gap for stabilizing the flow. Moreover, this processing is accomplished through the electrochemical interaction of the hydroxide ions and workpiece atoms, so there is no loss of workpiece characteristics, and since only hydrogen ions, hydroxide ions, and water molecules are present in ultra-pure water, and no metal ions or other such impurities are present, unlike with the aqueous solutions used in electrolytic processing and the like, if impurities from the outside are completely blocked off, then the processing can be performed in a perfectly clean atmosphere. A considerable reduction in cost is also possible since only ultra-pure water is used.

The second object of the present invention is to provide a method for washing with hydroxide ions in ultra-pure water, with which a shear flow of at least a specific velocity gradient having a controlled range and distribution is generated along the surface of a material to be washed, and the hydroxide ion density is increased on the washing surface of the washed material, or an electrical field is utilized to promote the stripping of ionic impurity metals, the result of which is that the above-mentioned problems are all solved, fine impurity metals can be completely removed, which was very difficult with ultrasonic washing in water, for example, and furthermore the removed impurity metals are prevented from re-adhering to the surface of the washed material, allowing the washing to be performed at greater efficiency.

In view of this, in order to achieve the stated second object, the second invention is a method for washing with hydroxide ions in ultra-pure water, comprising the steps of disposing a workpiece and a high pressure nozzle a specific distance apart from each other inside a washing tank containing only ultra-pure water, providing an ion exchange material or catalyst material that increases the amount of hydroxide ions between the processing surface of said workpiece and the distal end of the high pressure nozzle facing said surface, generating a high-speed shear flow of ultra-pure water sprayed from the high pressure nozzle near the surface of the workpiece, supplying hydroxide ions produced from the ultra-pure water to the workpiece surface, stripping from the workpiece surface any fine impurity metals adhering to the workpiece surface by means of the high-speed shear flow and a chemical elution reaction with hydroxide ions, and using the high-speed shear flow to prevent the impurity metals thus removed from re-adhering to the workpiece surface.

The second invention is also a method for washing with hydroxide ions in ultra-pure water, comprising the steps of disposing a workpiece and a high pressure nozzle a specific distance apart from each other inside a washing tank containing only ultra-pure water, applying a voltage using the high pressure nozzle as the cathode and the workpiece as the anode, generating a high-speed shear flow of ultra-pure water sprayed from the high pressure nozzle near the surface of the workpiece, stripping from the workpiece surface any fine impurity metals adhering to the workpiece surface by means of the high-speed shear flow and a chemical elution reaction with hydroxide ions, and using the high-speed shear flow to prevent the impurity metals thus removed from re-adhering to the workpiece surface.

The second invention is further a method for washing with hydroxide ions in ultra-pure water, comprising the steps of disposing a workpiece and a high pressure nozzle a specific distance apart from each other inside a washing tank containing only ultra-pure water, providing an ion exchange material or catalyst material that increases the amount of hydroxide ions between the processing surface of said workpiece and the distal end of the high pressure nozzle facing said surface, applying a voltage using the high pressure nozzle as the cathode and the workpiece as the anode, generating a high-speed shear flow of ultra-pure water sprayed from the high pressure nozzle near the surface of the workpiece, supplying hydroxide ions produced from the ultra-pure water to the workpiece surface, stripping from the workpiece surface any fine impurity metals adhering to the workpiece surface by means of the high-speed shear flow and a chemical elution reaction with hydroxide ions, and using the high-speed shear flow to prevent the impurity metals thus removed from re-adhering to the workpiece surface.

With these second inventions, if the spray opening in the high pressure nozzle is a round hole, then spot washing can be performed, and if the spray opening in the high pressure nozzle is a slit, line washing can be performed, undulating shape, or cylindrical shape over a large surface area. Also, it is preferable with the washing method of the present invention if a recovery means is provided on the downstream side of the high-speed shear flow generated by the high pressure nozzle, and any process reaction substances removed from the workpiece are recovered, because the removed impurity metals can be prevented from adhering to the workpiece surface.

With a method for washing with hydroxide ions in ultra-pure water as in the second inventions described above, hydroxide ions are produced by an ion exchange material, and these are efficiently supplied to the washed material surface by an electrical field and the flow of ultra-pure water sprayed from the high pressure nozzle, the result of which is that the density of hydroxide ions is higher near the washed material surface. Also, any reaction substances produced in the reaction between the hydroxide ions and the impurity metals adhering to the washed material surface are immediately removed from this surface by a high-speed shear flow of ultra-pure water, and re-adhesion can be prevented, so complete washing can be performed in a perfectly clean atmosphere. This effect can be utilized in the washing away of metal contaminants on a silicon wafer, which is particularly important in the field of semiconductors. Also, the washing apparatus can be more compact because a specific flow is produced only in the required area by the high pressure nozzle, and since washing is possible at an adequately large gap, it is extremely easy to control the gap for stabilizing the flow. Moreover, this washing is accomplished through the electrochemical interaction of the hydroxide ions and impurity metals, so there is no loss of the characteristics of the washed material.

DESCRIPTION OF THE PREFERRED EMBODIMENTS

Embodiments of the present invention will now be described in detail through reference to the appended drawings. First, the processing method of the first invention will be described, but since the washing method of the second inventions is basically the same, the majority of the following description is also directly applicable to the second inventions. Those aspects of the second invention that are different from the first invention will be discussed later.

Figure 1:
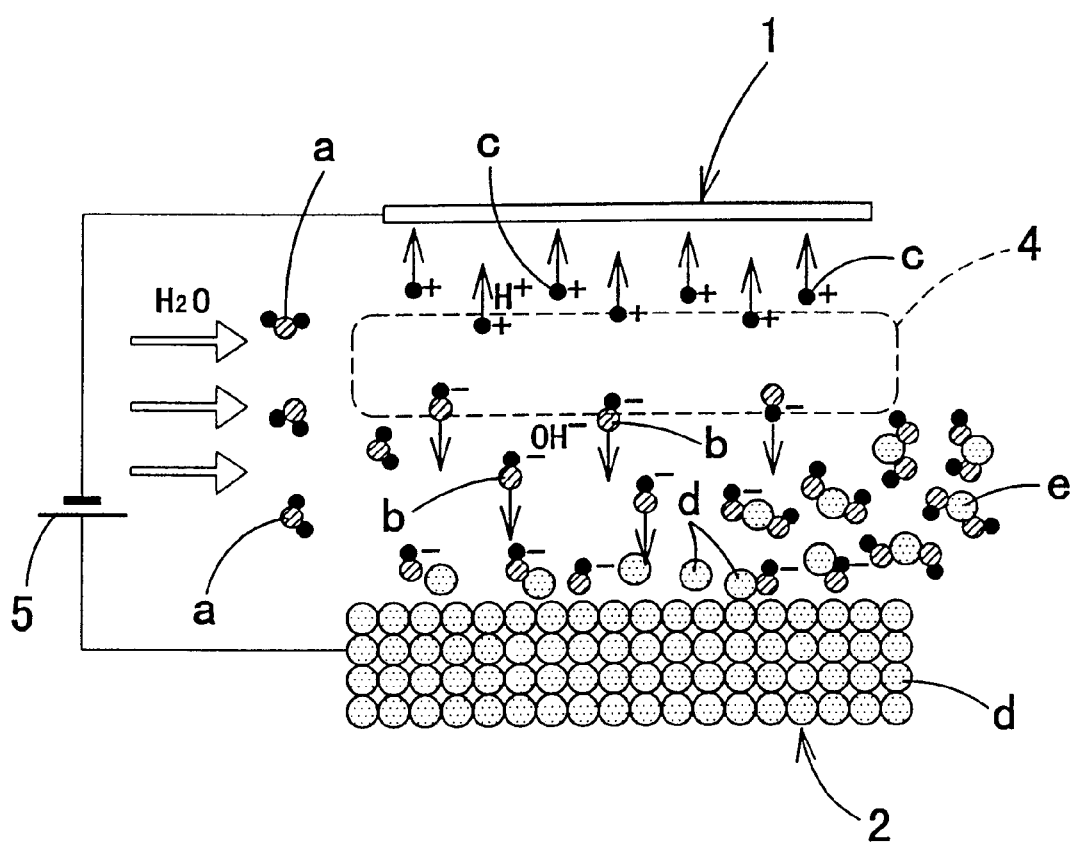
FIG. 1 is a concept diagram illustrating the processing principle in the first invention.
Figure 2:
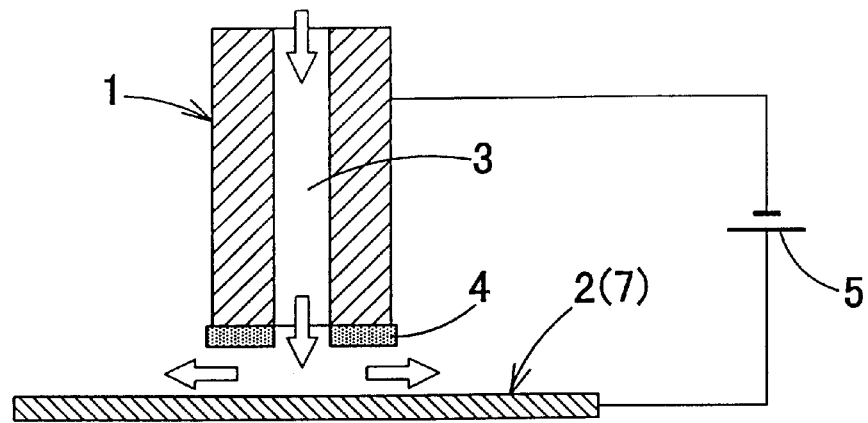
FIG. 2 is a concept diagram of the processing and washing apparatus of the present invention.
Figure 3:
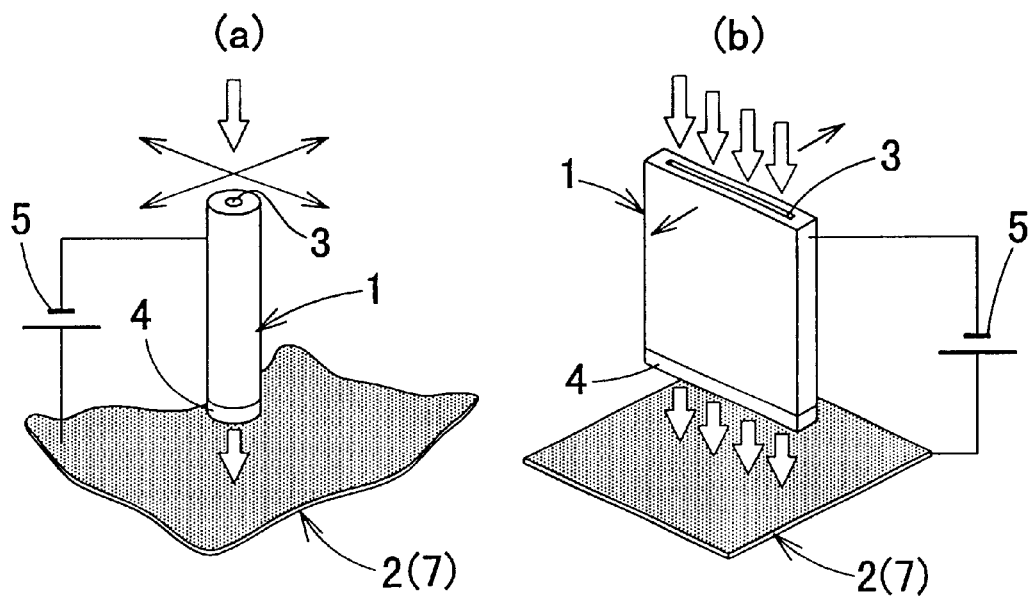
FIG. 3 illustrates the concept of this processing and washing apparatus, where (a) is a perspective view of a processing and washing apparatus that makes use of a high pressure nozzle having a spray opening in the form of a round hole, and (b) is a perspective view of a processing and washing apparatus that makes use of a high pressure nozzle having a spray opening in the form of a slit.
Figure 4:
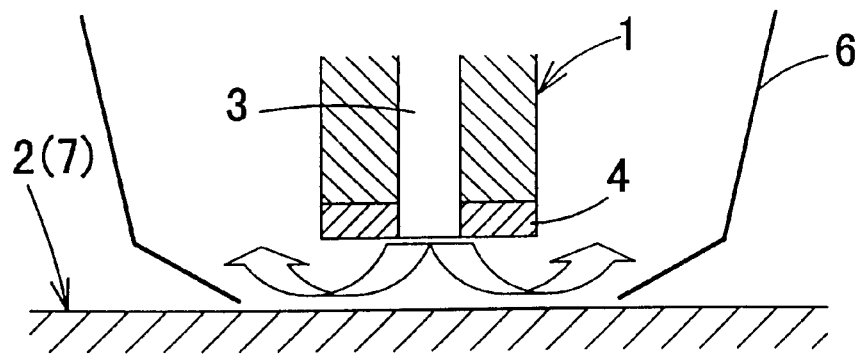
FIG. 4 consists of simplified cross sections of a nozzle structure equipped with a function for recovering reaction substances, with (a) illustrating a structure in which a recovery plate is disposed around a vertical-spray type of high pressure nozzle, and (b) a structure in which a recovery plate is disposed on the downstream side of a diagonal-spray type of high pressure nozzle.
Figure 4:
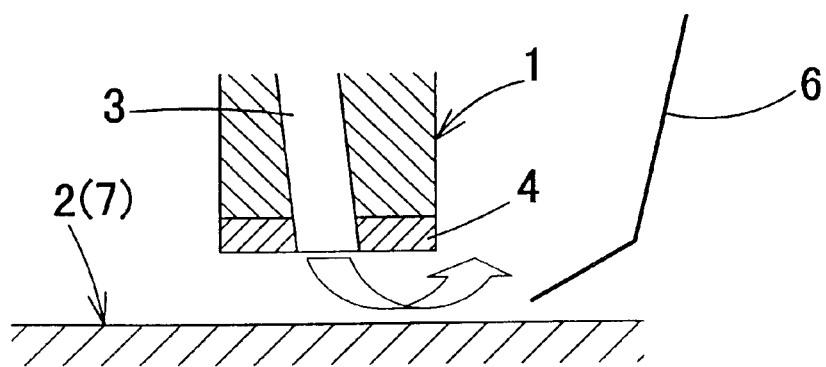

FIG. 1 illustrates the processing principle of the first invention, while FIGS. 2 to 4 illustrate the main components of the processing and washing apparatus used to implement the processing method of the first invention. In the figures, 1 is a high pressure nozzle, 2 is a workpiece, 3 is a spray opening, 4 is an ion exchange material, and 5 is a power supply.

Hydroxide ions are present not only in electrolytes of NaOH and the like used in electrolytic processing, but also in ultra-pure water, albeit in a very small amount ($10^{-7}$ mol/L at 25° C.). Because the amount of hydroxide ions in ultra-pure water is so small, though, the hydroxide ion density must be raised by some method in order to make processing practical. The first invention resides in processing a material in an ultra-purified environment by increasing the hydroxide ion density in the ultra-pure water, rather than by adding another solution. Therefore, no contamination of the workpiece surface occurs with the processing of the first invention.

The processing principle of the first invention is illustrated in FIG. 1. The basic structure is such that the ion exchange material 4 is disposed between the workpiece 2 (which is disposed in the ultra-pure water and serves as the anode) and the cathode (the high pressure nozzle 1) provided facing the workpiece 2, and the power supply 5 is connected between the workpiece 2 and the cathode (high pressure nozzle 1). With this structure, the water molecules a in the ultra-pure water are decomposed into hydroxide ions b and hydrogen ions c by the ion exchange material 4, and the hydroxide ions thus produced are supplied to the workpiece surface by the electrical field between the workpiece 2 and the cathode (high pressure nozzle 1) and by the flow of the ultra-pure water sprayed from the high pressure nozzle 1, which raises the density of the hydroxide ions near the workpiece. The reaction substances e produced by the reaction between the workpiece atoms d and the hydroxide ions b are eluted into the ultra-pure water, and the shear flow of the ultra-pure water along the surface of the workpiece 2 removes these reaction substances e from the surface of the workpiece 2. Alternatively, oxide film formation processing is performed by forming a clean oxide film on the workpiece surface through an oxidation reaction between the workpiece atoms and the hydroxide ions, with the desired shape being obtained by building up this oxide film.

It has been confirmed through computer simulation that took into account the interaction of quantum mechanics that when the hydroxide ions approach the workpiece atoms located on the workpiece surface, there is a reduction in the density of electrons that create back bonds of the workpiece atoms, that is, the bonding force becomes weaker, and eventually the workpiece atoms react and bond with the hydroxide ions, at which point the bonding force of the back bonds is at its lowest, becoming lower than the bonding force between the workpiece atoms and the hydroxide ions.

In other words, the hydroxide ions that serve as the processing tool are produced by a chemical reaction at a solid surface having an ion exchange function or catalyst function and placed near the workpiece surface, so the workpiece surface near this solid material surface that generates the hydroxide ions is preferentially processed, and the surface of the workpiece 2 can be processed into the desired shape by moving the location where this processing proceeds. So-called transfer processing is also possible, in which the shape of the ion exchange material that generates the hydroxide ions is transferred to the workpiece surface. The cutting of a sheet-form material is also possible if the shape of the ion exchange material that generates the hydroxide ions is linear. It is also possible to select whether the reaction induced at the material surface is an oxidation reaction or a removal processing reaction by adjusting processing parameters such as the amount in which the hydroxide ions are supplied.

FIG. 1 is a simplified illustration of the processing apparatus for implementing the method for processing with hydroxide ions in ultra-pure water of the first invention. More specifically, as shown in FIG. 2, the structure is such that the high pressure nozzle 1, which is made of a conductor, is disposed at a right angle or diagonally to the surface of the workpiece 2, and ultra-pure water is sprayed from the spray opening 3 of the high pressure nozzle 1 onto the surface of the workpiece 2. The ion exchange material 4 is attached around the distal end of the high pressure nozzle 1, the high pressure nozzle 1 is connected as the cathode to the power supply 5, and if the workpiece 2 is a conductor, it is connected as the anode directly to the power supply 5. If the workpiece 2 is an insulator, then the power supply 5 is connected to an anode located at the back of the workpiece 2, and if the workpiece 2 is a semiconductor, either the workpiece 2 is connected as the anode directly to the power supply 5, or the power supply 5 is connected to an anode located at the back of the workpiece 2. If the high pressure nozzle 1 is an insulator, then the ion exchange material 4 is attached after a cathode plate has been fixed to the distal end of the high pressure nozzle 1.

Upon reaching the surface of the workpiece 2, the ultra-pure water sprayed from the high pressure nozzle 1 flows as a high-speed shear flow along this surface. The hydroxide ions produced by the ion exchange material 4 are supplied to the surface of the workpiece 2 by the electrical field between the high pressure nozzle 1 and the workpiece 2 and by the flow of the ultra-pure water sprayed from the high pressure nozzle 1. As a result, the density of the hydroxide ions is raised near the surface of the workpiece 2, these hydroxide ions react with the workpiece atoms and produce processing reaction substances, and any processing reaction substances adhering to the surface of the workpiece 2 or eluted in the ultra-pure water are removed from the surface by the high-speed shear flow of ultra-pure water as the processing proceeds. When an oxide is formed through the oxidation of the workpiece atoms by the hydroxide ions, this becomes oxide film formation processing in which an oxide film is formed on the surface of the workpiece 2.

In FIG. 3(a) the high pressure nozzle 1 is cylindrical and the spray opening 3 is a round hole. In this case, a processing spot is formed over a tiny area on the processing surface, and these processing spots can be linked together to precisely form free curves on or make holes in the surface of the workpiece 2. In FIG. 3(b), the spray opening 3 of the high pressure nozzle 1 is a slit, in which case the processing mark is in the form of a line on the processing surface. This allows the surface of the workpiece 2 to be cut or given a flat mirror finish.

In FIG. 4, there is provided a recovery means so that the ultra-pure water that has been sprayed from the spray opening 3 of the high pressure nozzle 1 and that contains processing reaction substances produced through a reaction between the workpiece atoms and the hydroxide ions will be recovered immediately and efficiently. In FIG. 4(a), this recovery means comprises an annular recovery plate 6 disposed around and a specific distance away from the distal end of the high pressure nozzle 1, which is a vertical injection type here, and ultra-pure water containing the processing reaction substances flows between the high pressure nozzle 1 and the recovery plate 6. In FIG. 4(b), the recovery means comprises a partial recovery plate 6 disposed a specific distance away from the high pressure nozzle 1, which is a diagonal injection type here, and on the downstream side of the ultra-pure water from this nozzle. With the diagonal injection type in the example shown in FIG. 4(b), the high pressure nozzle 1 is placed at a right angle to the workpiece 2, and the spray opening 3 inside the high pressure nozzle 1 is tilted, but the high pressure nozzle 1 itself may also be tilted.

The ion exchange material 4 decomposes water molecules into hydroxide ions and hydrogen ions by utilizing an electrochemical reaction at a solid surface having an ion exchange function and placed in the ultra-pure water. This can comprise an ion exchange resin powder or a solid electrolyte packed in between water-permeable partition films or an ion exchange resin film, for example. The anode and cathode are arranged on either side of the ion exchange material 4, the hydroxide ions produced on the solid surface are separated to the anode side while the hydrogen ions are separated to the cathode side, and the workpiece used as the anode, or the workpiece located near the anode, is processed by the hydroxide ions. A catalyst material excites or activates the water molecules at a solid surface having a catalyst function, and produces hydroxide ions through the ionization or dissociation of the water molecules when voltage is applied between the anode and cathode.

The processing principle of the first invention here is that whether the processing is removal processing involving a chemical elution reaction or is oxide film formation processing involving an oxidation reaction can be selected by adjusting processing parameters such as the amount in which the hydroxide ions are supplied. As discussed below, although it will vary with the material of the workpiece 2, whether the processing is removal processing involving a chemical elution reaction or is oxide film formation processing involving an oxidation reaction can be controlled by means of the current density flowing between the high pressure nozzle 1 and the workpiece 2 when the ion exchange material 4 is used to produce the hydroxide ions.

In the first invention, ultra-pure water is sprayed from the high pressure nozzle 1 onto the processing surface of the workpiece 2, hydroxide ions are supplied to the surface of the workpiece 2, a shear flow is created along the processing surface, any processing reaction substances produced by reaction on the surface of the workpiece 2 are immediately removed from the surface, and a fresh surface is always exposed on the workpiece 2 so that the processing rate will be higher. A fluid analysis model was used to numerically calculate what happens to the flow of ultra-pure water sprayed from the high pressure nozzle near the location directly under the nozzle.

Figure 5:
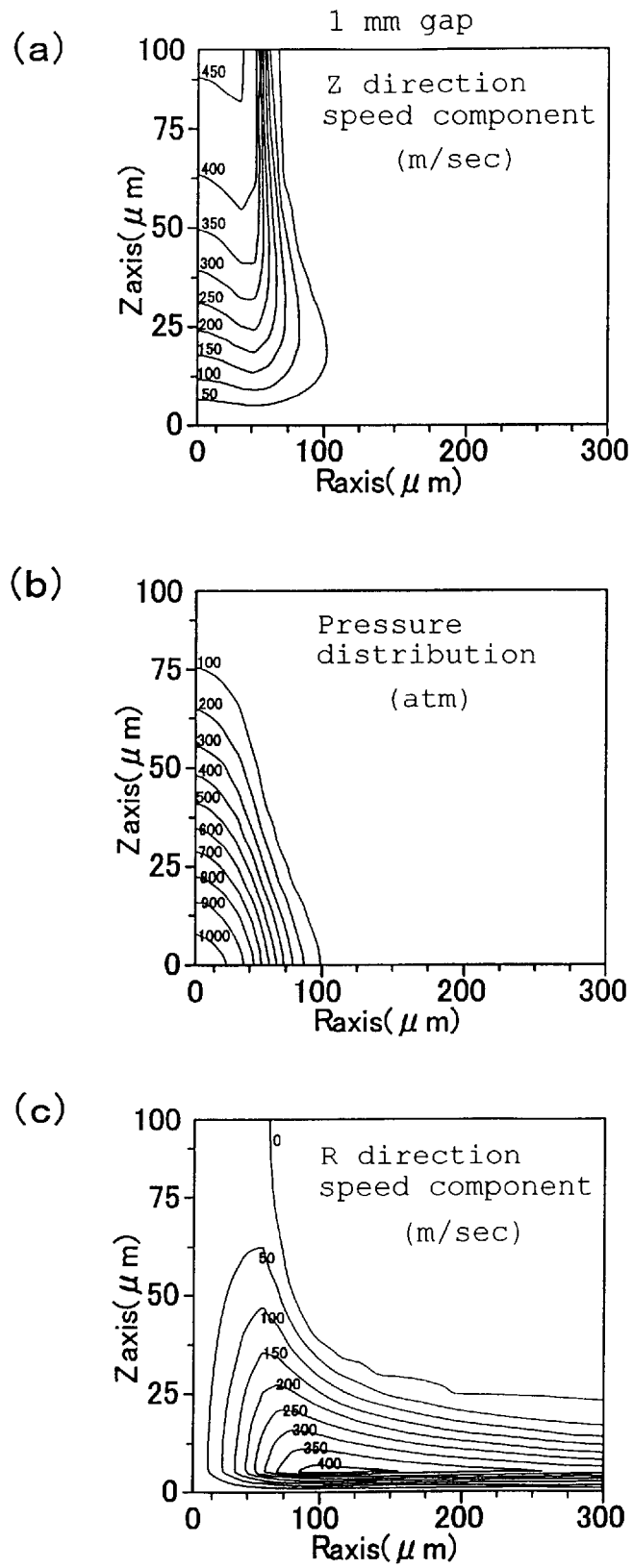
FIG. 5 consists of graphs of the results of a simulation of the pressure and velocity components when ultra-pure water is sprayed at a right angle and a gap of 1 mm from a high pressure nozzle onto a workpiece surface or washed material surface, where (a) shows the Z direction velocity component, (b) the pressure distribution, and (c) the R direction velocity component.
Figure 6:
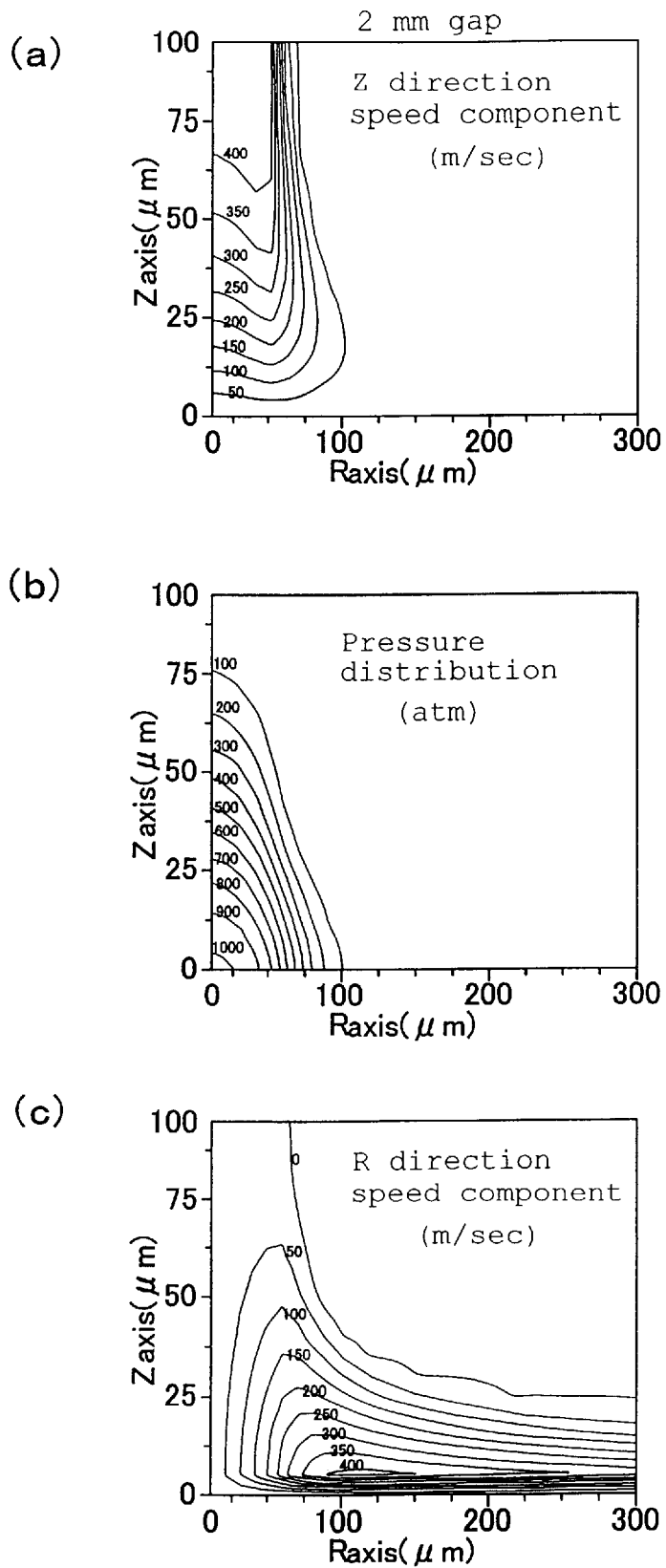
FIG. 6 consists of graphs of the results of a simulation of the pressure and velocity components when ultra-pure water is sprayed at a right angle and a gap of 2 mm from a high pressure nozzle onto a workpiece surface or washed material surface, where (a) shows the Z direction velocity component, (b) the pressure distribution, and (c) the R direction velocity component.

In this analysis model, the nozzle was in perpendicular axial symmetry to the workpiece surface, and the Navier-Stokes equation of motion was numerically solved by difference calculus based on an approximation of an incompressible fluid. The calculation was performed assuming that the nozzle hole diameter was 0.1 mm, the outside diameter was 2 mm, and the gap between the nozzle tip and the workpiece surface was 1 mm and 2 mm. The pressure at which the fluid was supplied to the nozzle was 1000 atm. The pressure distribution and the flow distribution in the nozzle hole direction (Z axis direction) and radial direction (R direction) were found at each gap. FIG. 5 shows the results when the gap was 1 mm, and FIG. 6 when the gap was 2 mm.

These calculation results revealed that the pressure loss due to viscosity of the fluid in the analysis region is approximately 50 atm. A flow (approximately 450 m/sec) in the nozzle hole direction equivalent to a dynamic pressure of about 950 atm is generated at the inlet (see FIG. 5(a)), and this flow moves substantially straight ahead up to the vicinity of the workpiece surface (about 75 $\mu$m from the workpiece surface), after which it decelerates. In the course of this, the dynamic pressure is converted into static pressure near the surface of the workpiece, and after a static pressure of about 950 atm is generated (see FIG. 5(b)), it is converted back into dynamic pressure as a flow in the radial direction (see FIG. 5(c)). It was found that this radial flow is generated in an extremely thin layer along the workpiece surface (approximately 25 $\mu$m from the workpiece surface), and a shear flow can be generated extremely effectively on the workpiece surface. Substantially equivalent flows are generated when the gap is 1 mm and 2 mm, which indicates that the gap is extremely easy to control. Under these conditions, when the gap is both 1 mm and 2 mm, the maximum velocity gradient on the workpiece surface is about 100 m/sec·$\mu$m.

Figure 7:
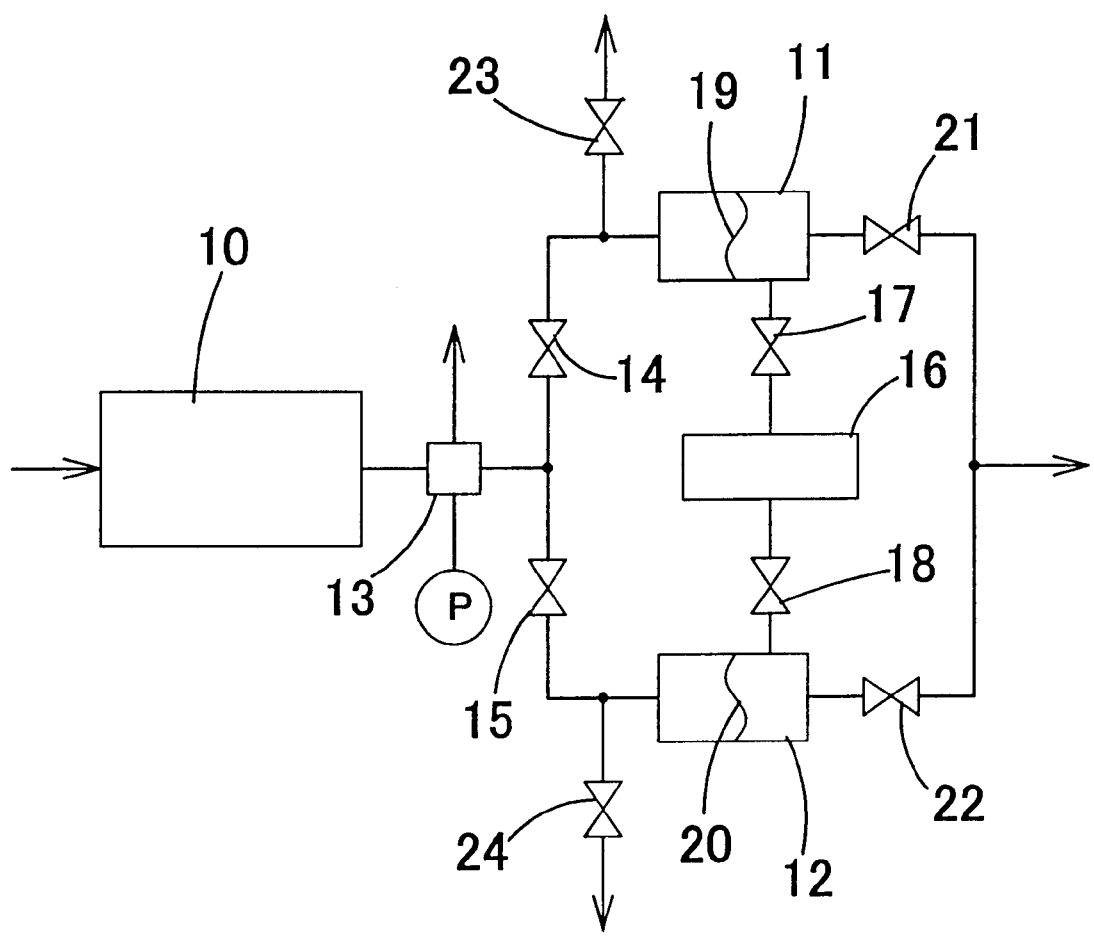
FIG. 7 is a simplified piping diagram of a high pressure ultra-pure water supply system.

The system for supplying high pressure ultra-pure water to the high pressure nozzle 1 will now be briefly described on the basis of FIG. 7. A plunger pump is used as the pump 10 for generating pressure. Also, if the ultra-pure water is pressurized directly by the pump, there will be a problem with contamination by particles and so forth generated in the moving components inside the pump, so a system is employed in which the processing-use ultra-pure water is pressurized via a diaphragm or bellows made of PTFE or SUS. There are two sets of pressurization components 11 and 12 for the ultra-pure water. City water is pressurized to a specific pressure by a single plunger pump 10, and the water is diverted by a regulator 13 into two channels, which are connected to the above-mentioned pressurization components 11 and 12 via valves 14 and 15, respectively. Meanwhile, the processing-use ultra-pure water is connected from an ultra-pure water supply apparatus 16 to the pressurization components 11 and 12 via valves 17 and 18, respectively. Inside the pressurization components 11 and 12, the city water and the ultra-pure water are separated by PTFE or SUS diaphragms 19 and 20, the ultra-pure water is pressurized at the pressure of the city water through these diaphragms 19 and 20, and the ultra-pure water pressurized in the pressurization components 11 and 12 is merged via valves 21 and 22 before being supplied to the high pressure nozzle 1. A drain valve 23 is provided between the valve 14 and the pressurization component 11, and a drain valve 24 is provided between the valve 15 and the pressurization component 12. Electromagnetic valves are employed for all of these valves, and they can be opened and shut by a computer.

This high pressure ultra-pure water supply system operates as follows. First, ultra-pure water of substantially the same pressure as atmospheric pressure is manufactured in the ultra-pure water supply apparatus 16. Since it is difficult to continuously pressurize this ultra-pure water, in the above system the ultra-pure water is alternately pressurized from atmospheric pressure up to a specified pressure by the two pressurization components 11 and 12, and high pressure ultra-pure water is continuously supplied to the high pressure nozzle 1. In specific terms, in the pressurization component 11 system, the valves 14 and 21 are opened, the valves 17 and 23 are closed, and pressurized city water is supplied into pressurization component 11, in which the pressurized ultra-pure water is supplied to the high pressure nozzle 1 via the diaphragm 19, while in the pressurization component 12 system, the valves 15 and 22 are closed, the valves 18 and 24 are opened, and ultra-pure water is supplied from the ultra-pure water supply apparatus 16 into the pressurization component 12 while city water is drained from the pressurization component 12. The valve 24 is opened to prevent the ultra-pure water supply apparatus 16 from bursting under pressure and the valve 18 is opened after the inside of the pressurization component 12 returned to atmospheric pressure. Next, the valves 18 and 24 are closed, the valve 15 is opened, pressurized city water is supplied into the pressurization component 12, and the ultra-pure water is pressurized. When the supply pressure is reached, the valve 22 is opened, the valves 21 and 14 are closed, the valve 23 is opened, the city water inside the pressurization component 11 is drained out, and the inside of the pressurization component 11 drops to atmospheric pressure, after which the valve 17 is opened and ultra-pure water is supplied from the ultra-pure water supply apparatus 16 into the pressurization component 11 while the city water is drained. Thereafter this process is repeated over and over, with the opening and closing timing of the valves being controlled by a computer, and high pressure ultra-pure water being continuously supplied to the high pressure nozzle 1.

Figure 8:
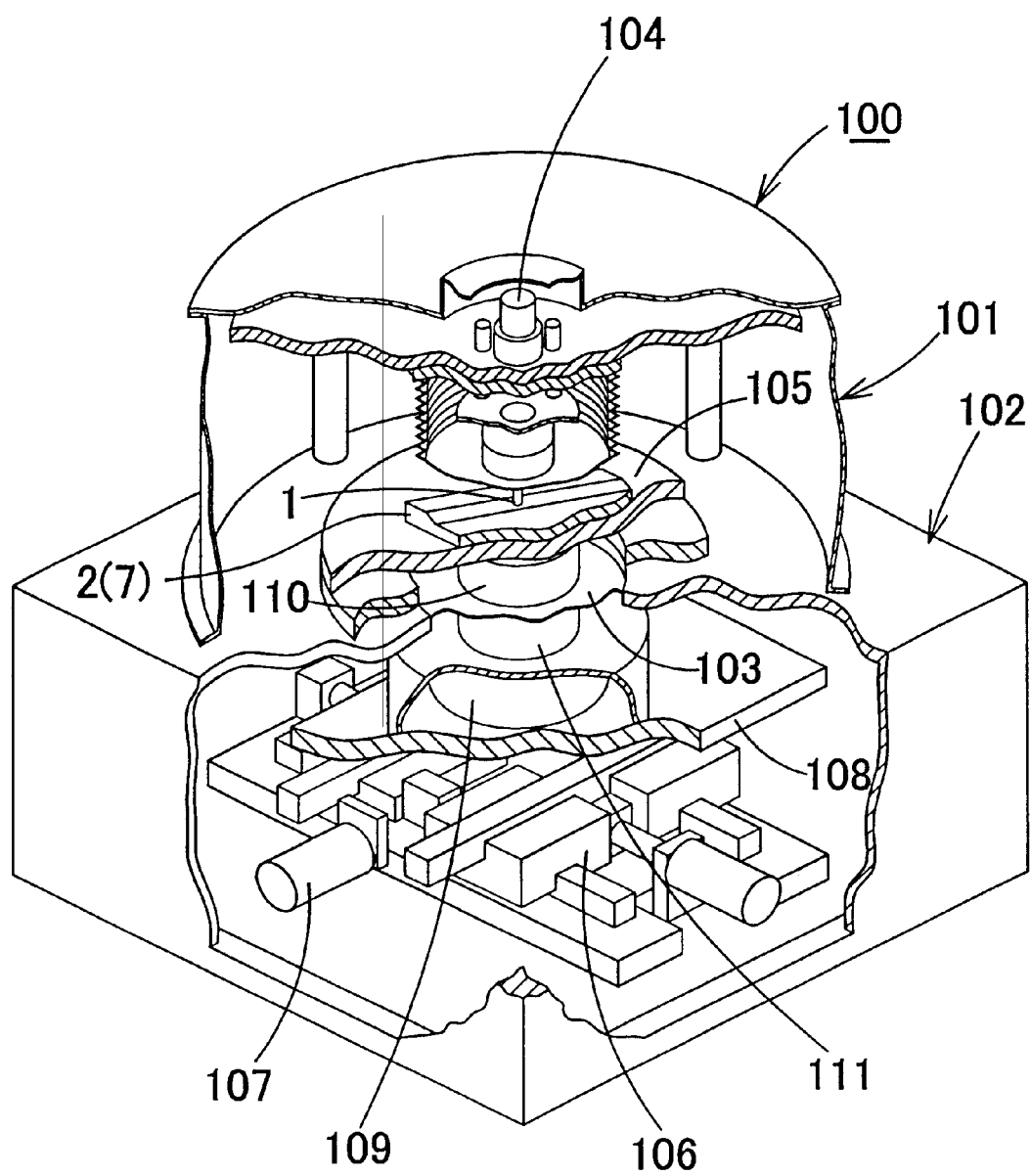
FIG. 8 is a simplified perspective view showing a partially cut-away processing and washing apparatus that employs the method of the present invention.

Next, FIG. 8 illustrates an overall specific example of a processing apparatus that employs the method for processing with a high-speed shear flow of the first invention. This processing apparatus 100 has at its upper part a washing tank 101 filled with ultra-pure water, and has at its lower part a drive mechanism 102 with a built-in X-Y-θ drive system. The washing tank 101 and driven mechanism 102 are separated by a partition 103 made of a non-magnetic material, which keeps the inside of the washing tank 101 from being contaminated with particles and so forth generated from the moving parts of the drive system. The high pressure nozzle 1 connected to a Z axis drive system 104 is provided in the upper part, and a sample holder 105 is provided in the lower part and is able to rotate and move horizontally through ultra-pure water static pressure support. To this holder is fixed the workpiece 2, which faces the high pressure nozzle 1. The drive mechanism 102 has an XY table 108 that can be moved horizontally by an X axis drive system 106 and a Y axis drive system 107, and a θ axis drive system 109 is provided to this XY table 108. A permanent magnet 110 fixed to the underside of the sample holder 105 and a permanent magnet 111 fixed to the θ axis drive system 109 are magnetically coupled facing each other via the partition 103, and the displacement produced by the X-Y-θ drive system is transmitted to the sample holder 105 through these permanent magnets 110 and 111. Thus, the high pressure nozzle 1 and the workpiece 2 can be relatively displaced in the X-Y-Z-θ axis directions by the various drive systems, allowing the workpiece 2 to be processed into the specified shape by the high pressure nozzle 1.

With this processing apparatus 100, there is a system for extracting by liquid phase separation from the washing tank 101 an amount of ultra-pure water equivalent to the ultra-pure water sprayed from the high pressure nozzle 1 and the ultra-pure water flowing from the ultra-pure water static pressure support component of the sample holder 105 into the washing tank 101. The impurity concentration in the extracted ultra-pure water is reduced as much as possible by a refining apparatus, after which this water is sent back to the static pressure support component. This system makes it possible to remove even trace amounts of metal ions eluted from the structural components inside the washing tank 101.

Figure 9:
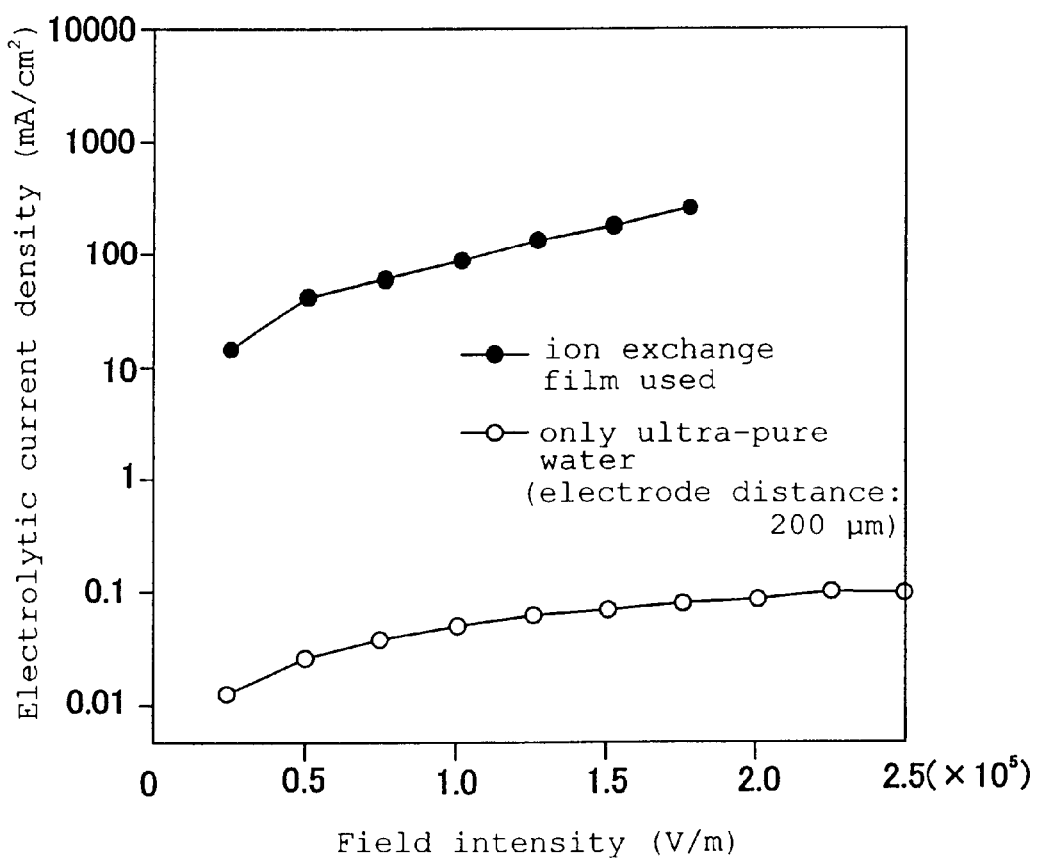
FIG. 9 is a graph of the results of comparing the relationship between electrical field intensity and electrolytic current density when an ion exchange material is used, to when only ultra-pure water is used, and no ion exchange material.

Finally, FIGS. 9 to 14 show the results of tests in which various materials were subjected to actual processing. First, the graph in FIG. 9 shows the relationship between electrical field intensity and electrolytic current density when a strongly acidic cation exchange film (Nafion 117, trademark of DuPont) is used as the ion exchange material 4, as compared with ultra-pure water alone, without any ion exchange material 4 being used. It can be seen from this graph that the use of the ion exchange material 4 increases the density of hydroxide ions by about $10^3$ to $10^4$ times versus the density of hydroxide ions in untreated ultra-pure water ($10^{-7}$ mol/L at 25° C.). This therefore means that processing becomes much faster when the ion exchange material 4 is used. When the ultra-pure water is sprayed from the high pressure nozzle 1 toward the workpiece 2, there is the additional action of transporting hydroxide ions to the workpiece surface, and an exposure action whereby the processing reaction substances are removed from the surface of the workpiece 2 and fresh workpiece surface is constantly being exposed. This makes the processing faster still.

Figure 10:
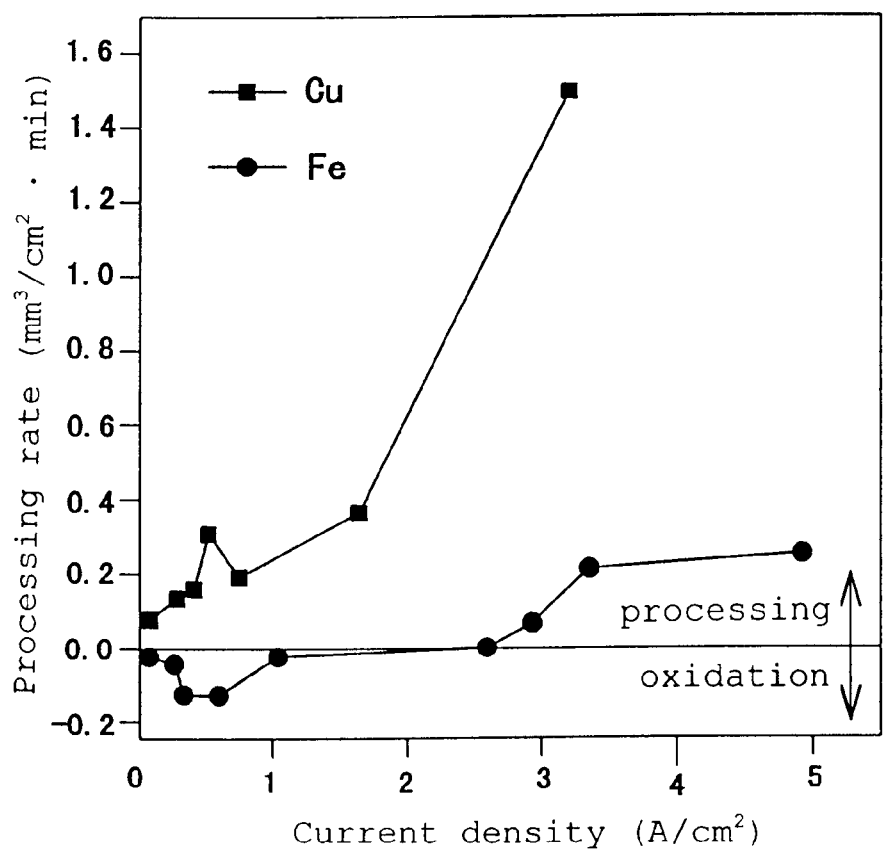
FIG. 10 is a graph of the change in processing rate when the current density flowing between the high pressure nozzle and the workpiece is varied for copper and iron.

FIG. 10 shows the change in processing rate when the current density flowing between the high pressure nozzle 1 and the workpiece 2 is varied, with copper (Cu) and iron (Fe) selected as the workpiece 2. With copper, the processing rate rises sharply when the current density is increased, with removal processing exhibiting a tendency to begin from a current density of zero. When the current density was increased with iron, on the other hand, oxide film formation processing occurred from zero up to about 2 A/cm², but when the current density was increased beyond this point, there was a change to removal processing, with the tendency being for the processing rate to increase, albeit slowly, along with increases in current density. The units for processing rate used here are the volume (mm³) processed per unit of time (min) per unit of surface area (cm²), which is a ten-fold value when converted to thickness (µm) processed per unit of time (min). Specifically, this is [mm³/cm²·min]=10 [µm/min]. It was thus found that processing characteristics vary greatly from material to material, so the processing characteristics of various material were examined in order to find the control conditions for controlling whether the processing is for removal or for oxide film formation. These results are given below.

Figure 11:
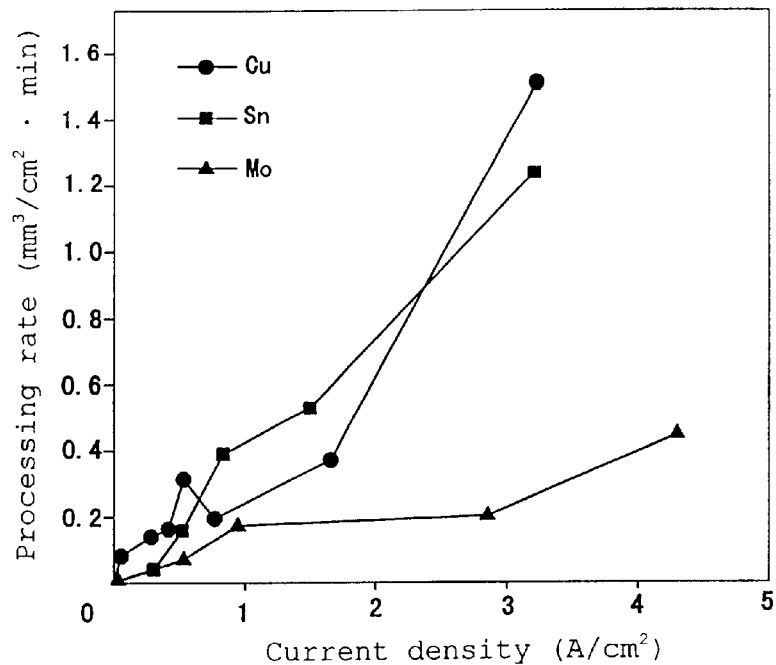
FIG. 11 consists of graphs of processing characteristics for copper, tin, and molybdenum, where (a) is a graph of the change in processing rate versus current density, and (b) is a graph of the change in current efficiency versus current density.
Figure 11:
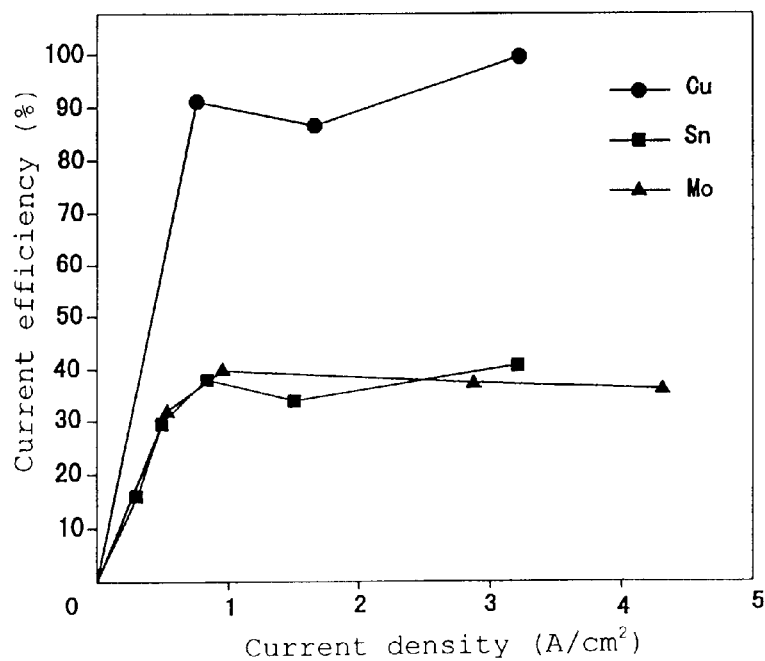

FIG. 11 shows the processing characteristics for tin (Sn) and molybdenum (Mo), which exhibit the same tendency as copper. FIG. 11(a) is a graph of the change in processing rate versus current density, and FIG. 11(b) is a graph of the change in current efficiency versus current density. Copper, tin, and molybdenum were the same in that the rate of removal processing increased when the current density was raised.

Figure 12:
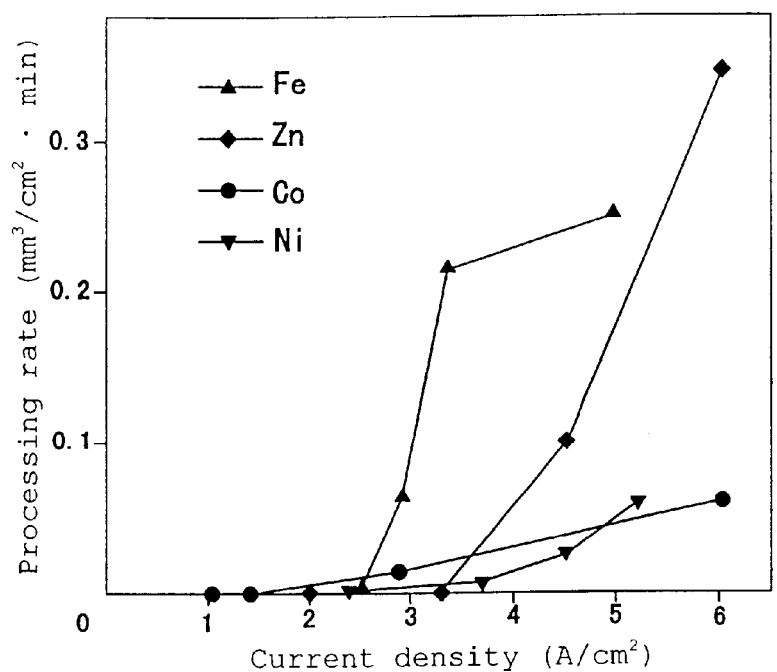
FIG. 12 consists of graphs of processing characteristics for iron, zinc, cobalt, and nickel, where (a) is a graph of the change in processing rate versus current density, and (b) is a graph of the change in current efficiency versus current density.
Figure 12:
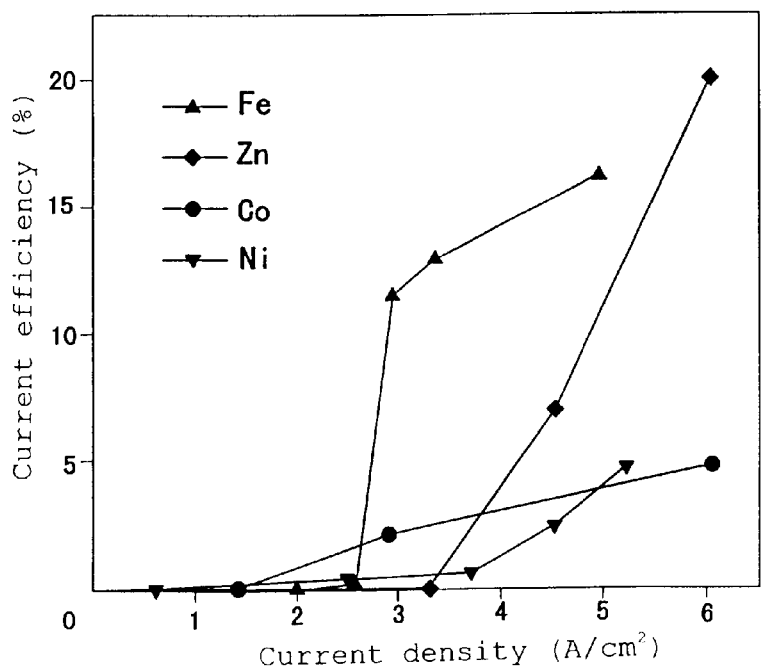

FIG. 12 shows the processing characteristics of zinc (Zn), cobalt (Co), and nickel (Ni), which exhibit the same tendency as iron. FIG. 12(a) is a graph of the change in processing rate versus current density, and FIG. 12(b) is a graph of the change in current efficiency versus current density. In this case, in the region where the current density is low, oxide film formation processing occurs with zinc, cobalt, and nickel, but once a certain current density is exceeded, there is a switch to removal processing, just as with iron. The graphs in FIG. 12 show the processing rate in just the removal processing region for the various materials mentioned above, and in this removal processing region, there is a tendency for the processing rate to rise gradually as the current density increases.

Figure 13:
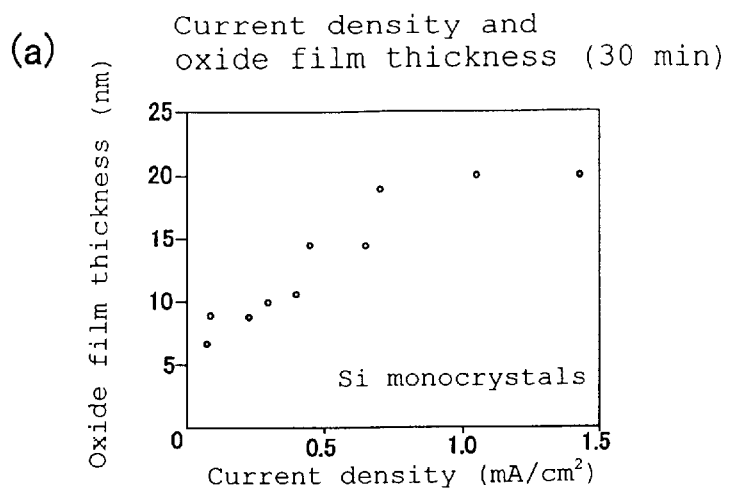
FIG. 13 shows the processing characteristics of silicon monocrystals, where (a) is a graph of oxide film thickness versus current density with the processing time fixed at 30 minutes, (b) is a graph of oxide film thickness versus processing time with the current density fixed at 0.65 mA/cm$^2$, and (c) is a graph of the amount of dissolved oxygen versus processing time when the current density is 0.30 mA/cm$^2$, 0.65 mA/cm$^2$, and 1.05 mA/cm$^2$.
Figure 13:
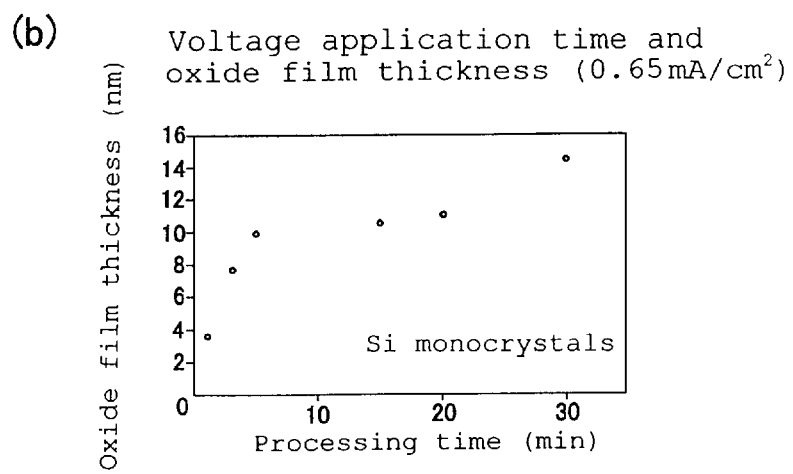
Figure 13:
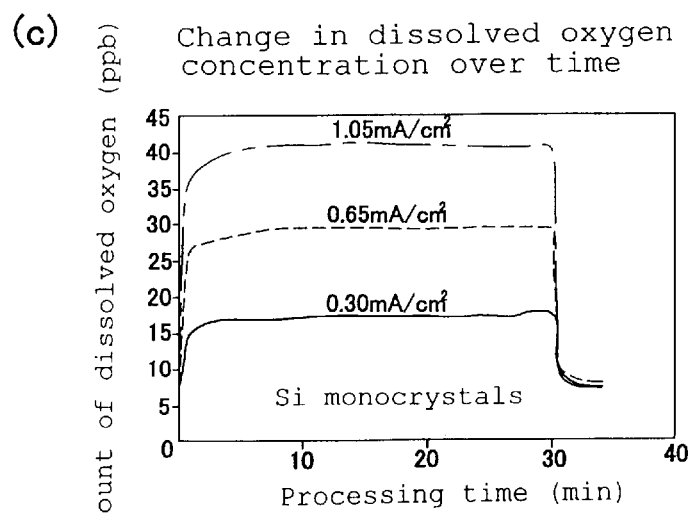

FIG. 13 shows the processing characteristics with silicon (Si) monocrystals. FIG. 13(a) is a graph of oxide film thickness versus current density with the processing time fixed at 30 minutes, with the processing rate corresponding to a region of negative oxide film formation processing. FIG. 13(b) is a graph of oxide film thickness versus processing time with the current density fixed at 0.65 mA/cm$^2$. FIG. 13(c) is a graph of the amount of dissolved oxygen versus processing time when the current density is 0.30 mA/cm$^2$, 0.65 mA/cm$^2$, and 1.05 mA/cm$^2$. It can be seen from these graphs that with silicon the oxide film thickness increases along with current density, but there is a peak to this oxide film thickness with respect to increases in current density, with the oxide film tending to become thinner as current density subsequently increases. It can also be seen that there is little change in the oxide film thickness when the processing time is extended. Therefore, it can be predicted at a high probability that when the current density is further increased, there will be a change from oxide film formation processing to removal processing with silicon monocrystals as well. It has also been confirmed that material exhibiting the same tendency in processing characteristics as silicon monocrystals include aluminum (Al) and titanium (Ti).

Figure 14:
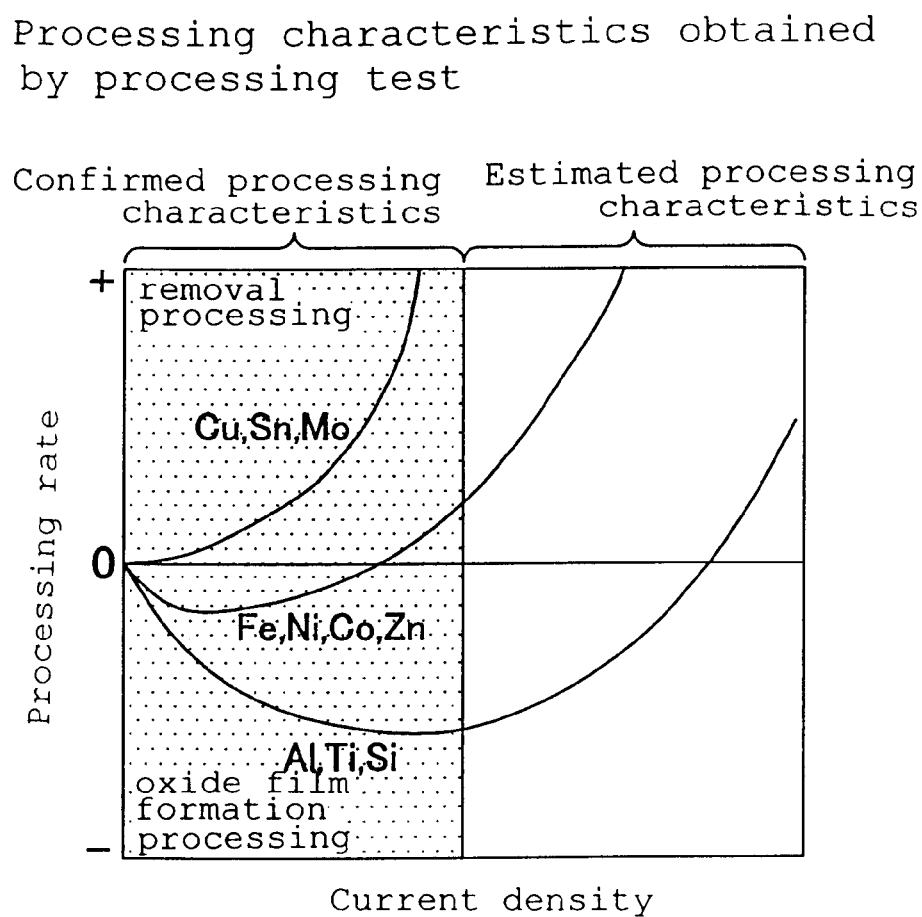
FIG. 14 is a graph of the processing characteristics of various materials.

FIG. 14 is a graph of the processing characteristics of the various materials discussed above. In this graph, the range of tested current density is shown as the "Confirmed processing characteristics," while the range of current density beyond this is shown as the "Estimated processing characteristics." As can be seen from this graph, the types of materials are broadly divided into Cu-, Fe-, and Si-types. The Cu-type processing characteristics are such that removal processing begins at a current density of zero, while the Fe- and Si-type processing characteristics are such that oxide film formation processing occurs when the current density is low, but changes to removal processing once a certain current density threshold is crossed. This threshold value is considerably larger with Si-types than with Fe-types.

It was confirmed by this test that the processing rate can be controlled in removal processing and oxide film formation processing by varying the current density. It was also found that the selection of either removal processing or oxide film formation processing can be controlled in this way, thereby confirming the efficacy of the first invention.

Figure 15:
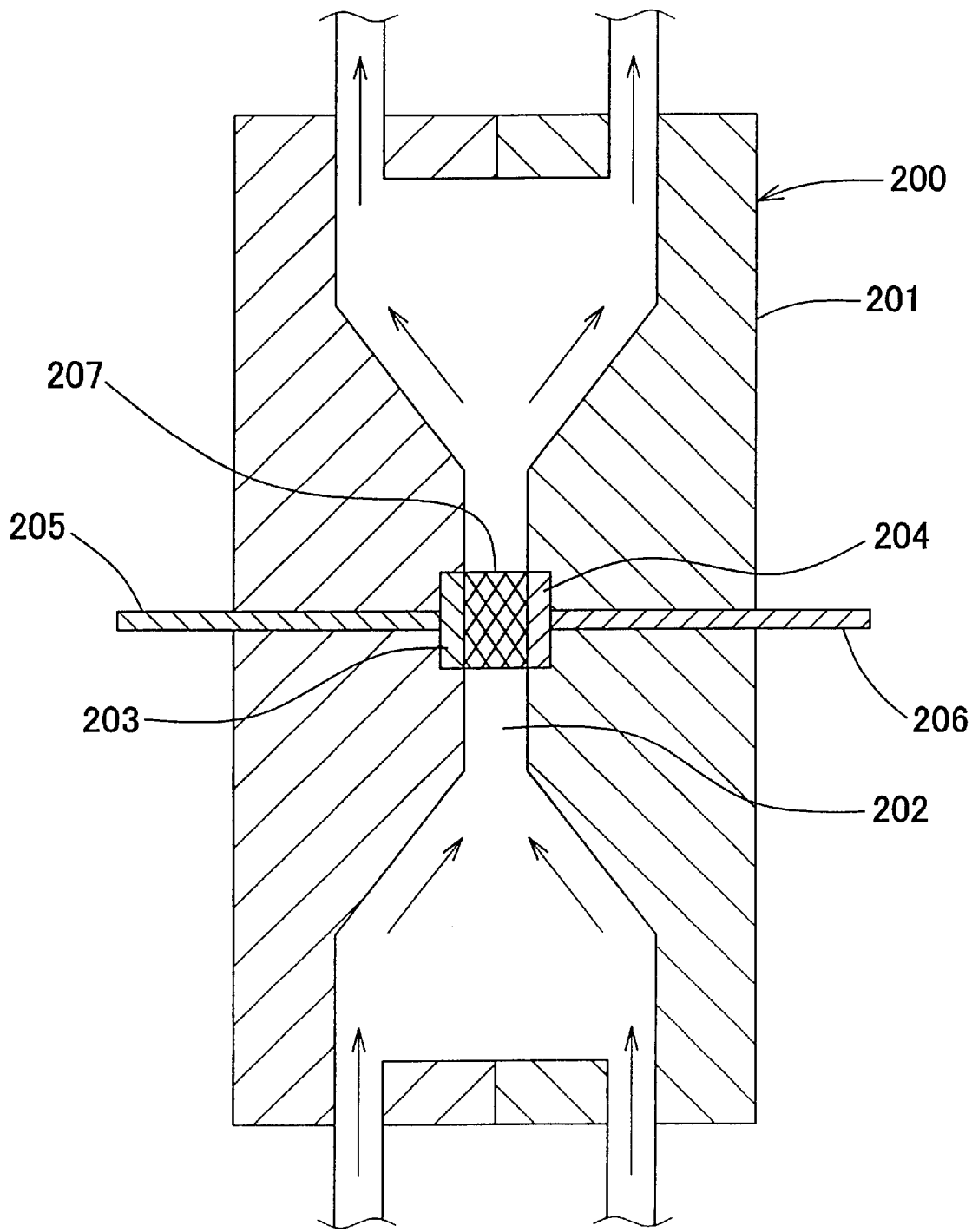
FIG. 15 is a simplified cross section of an apparatus for conducting a test in which various types of ion exchange material are used to increase the amount of hydroxide ions, and for conducting a preliminary processing test.

Although the processing principle of the first invention was confirmed through the test described above, actual processing of a material at a practical processing rate requires a further increase in the hydroxide ion concentration and a further increase in current density. Accordingly, various ion exchange materials were tested, the results of which are described below. FIG. 15 shows a test apparatus 200. With this test apparatus 200, an ultra-pure water channel 202 is formed inside a main unit 201 made of a PEEK resin, an anode plate 203 and a cathode plate 204 are fixed precisely parallel within this channel 202, an anode lead pin 205 connected to the anode plate 203 and a cathode lead pin 206 connected to the cathode plate 204 are taken out from the main unit 201, and an ion exchange material 207 is held between the anode plate 203 and the cathode plate 204. Ultra-pure water can be supplied at a specific flow rate from a supply system (not shown) to the ultra-pure water channel 202. The anode lead pin 205 and the cathode lead pin 206 are connected via a current meter to a DC power supply (not shown), and DC voltage is applied between the anode plate 203 and the cathode plate 204. The gap, that is, the channel width, here between the anode plate 203 and the cathode plate 204 is 0.8 mm, the surface area of the electrode plates facing the channel is set at 1 cm$^2$ (1 cm×1 cm), and the flux of ultra-pure water is 300 mL/min.

Figure 16:
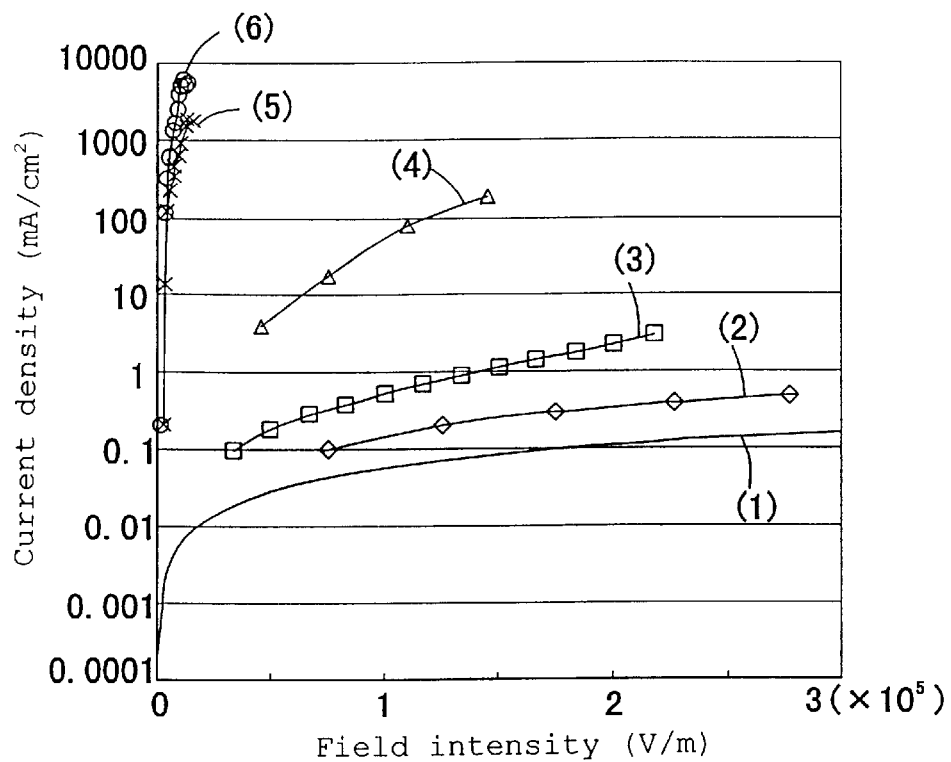
FIG. 16 is a graph of current density versus field intensity as measured for various types of ion exchange material.

FIG. 16 shows the results of a test of current density versus electrical field intensity when the above-mentioned strongly acidic cation exchange film A (Nafion 117), a strongly acidic cation exchange film B (a graft polymerized film made by EBARA Corp.), and a strongly basic anion exchange film C (a graft polymerized film made by EBARA Corp.) were used as the ion exchange material and platinum (Pt) was used for both electrode plates. FIG. 16 also shows the theoretical values (indicated by (1) in the graph) and measured values (indicated by (2) in the graph) when just ultra-pure water was used. The strongly acidic cation exchange film B here was produced by graft-polymerizing glycidyl methacrylate (GMA) as a side chain onto a main chain of a composite fiber (approximately 16 $\mu$m in diameter) of polyethylene terephthalate (PET) and polyethylene (PE). (3) in the graph shows the results when the strongly acidic cation exchange film A was not in contact with both electrodes, and (4) shows the results when the same ion exchange film was in contact with the cathode. (5) in the graph shows the results when the strongly basic anion exchange film C was in contact with both electrodes, and (6) shows the results when the strongly acidic cation exchange film B was in contact with both electrodes. As a result, the maximum current density of 5.4 A/cm$^2$ when the strongly acidic cation exchange film B was used and the maximum current density of 1.8 A/cm$^2$ when the strongly basic anion exchange film C was used are approximately 10,000 times greater than the current density when an ion exchange film was not used, and are approximately 30 times greater than the current density when the strongly acidic cation exchange film A was in contact with the cathode. These results are very significant in terms of determining the direction of future development.

Figure 17:
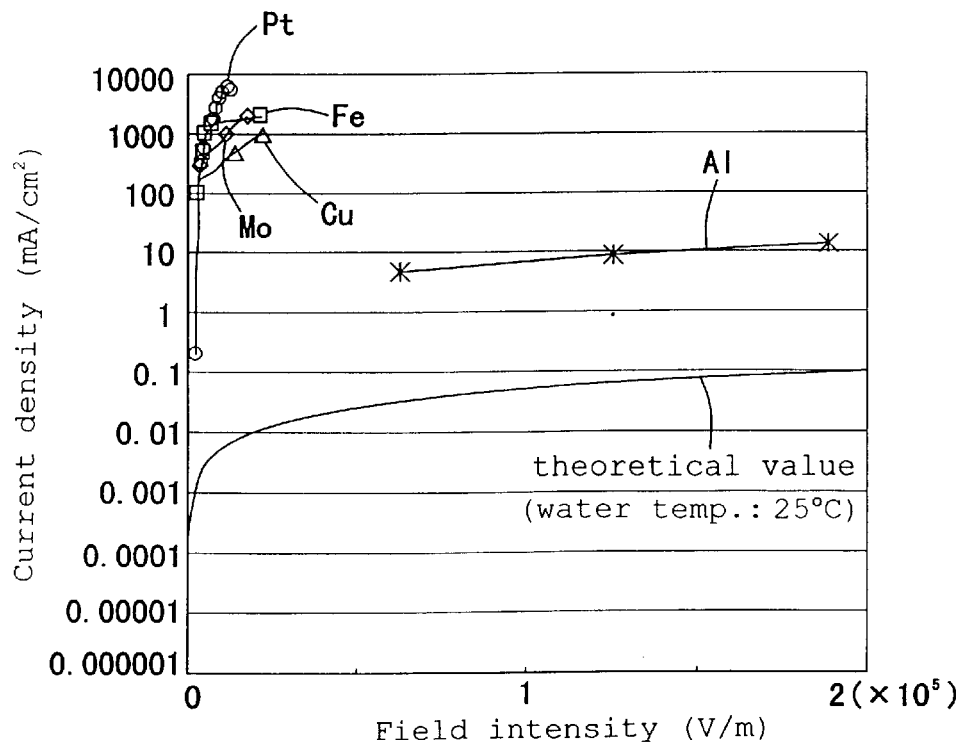
FIG. 17 is a graph of current density versus field intensity when plates of platinum, aluminum, copper, iron, and molybdenum were used as anode plates, and a platinum plate was used as the cathode plate.
Figure 18:
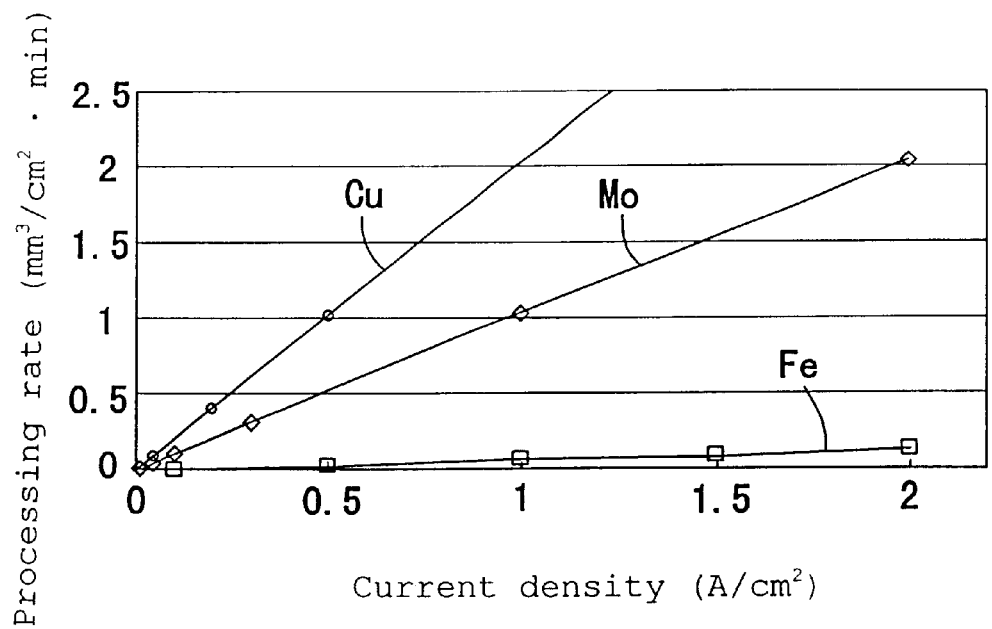
FIG. 18 is a graph of the current density dependence of processing rate when plates of molybdenum, iron, and copper were used as anode plates.
Figure 19:
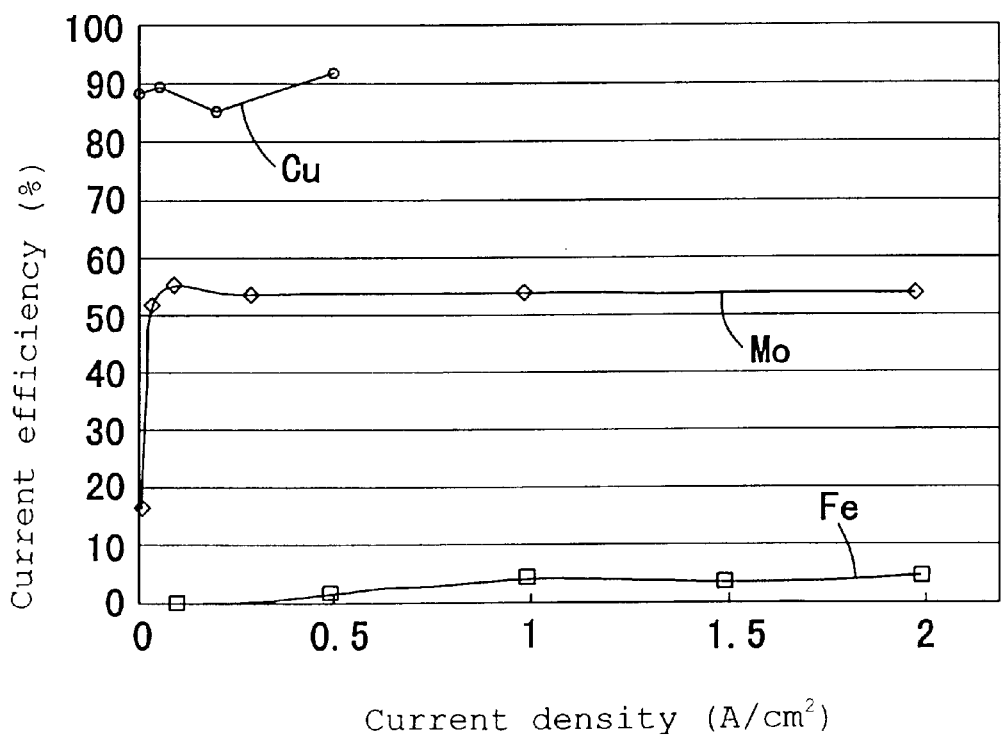
FIG. 19 is a graph of the current density dependence of current efficiency when plates of molybdenum, iron, and copper were used as anode plates.

Next, FIGS. 17 to 19 show the results of conducting a processing test using various metal plates as the anode plate under the conditions with which the maximum current density was obtained in the above test, that is, conditions in which the strongly acidic cation exchange film B was in contact with both electrodes. FIG. 17 shows the results for current density versus electrical field intensity when aluminum, copper, iron, and molybdenum were used for the anode plate and platinum was used for the cathode plate. FIG. 17 also shows the theoretical values when only ultra-pure water was used (water temperature: 25° C.), and the results when both electrode plates were made of platinum. As a result, the current density obtained when platinum was used for the anode was roughly the same order as when the metal materials copper, molybdenum, and iron were used. In contrast, the current density when aluminum was used for the anode was only 15 mA/cm² at best. The reason for this is that an oxide film is formed on the surface of aluminum when voltage is applied, there is a sudden increase in electrical resistance, and the current quickly drops to close to zero when voltage is applied.

It was confirmed through this test that copper, molybdenum, and iron can be processed at a high current density of 1 A/cm², but with this test apparatus, sludge produced by processing adhered to the ion exchange material and the electrode surfaces because of the extremely low flow rate of the ultra-pure water, and this drastically decreased the current, so further processing was impossible. As mentioned above, this problem can be solved by forming a high-speed shear flow of ultra-pure water along the surface of the workpiece (cathode plate), and quickly removing from the processing surface any reaction substances produced by the reaction with the hydroxide ions.

FIGS. 18 and 19 show the results of a test of the current density dependence of processing rate and current efficiency, respectively, when molybdenum, iron, and copper plates were used as the anode plate. It can be seen from FIG. 18 that molybdenum, iron, and copper all exhibit a linear increase in processing rate versus current density. Also, it can be seen from FIG. 19 that with molybdenum, the current efficiency is approximately 50% at a current density of 40 mA/cm² or higher, with iron, although there was some variance, the current efficiency is approximately 5% at a current density of 1 A/cm² or higher, and with copper, the current efficiency was far higher than with the first two, at approximately 90%.

Figure 20:
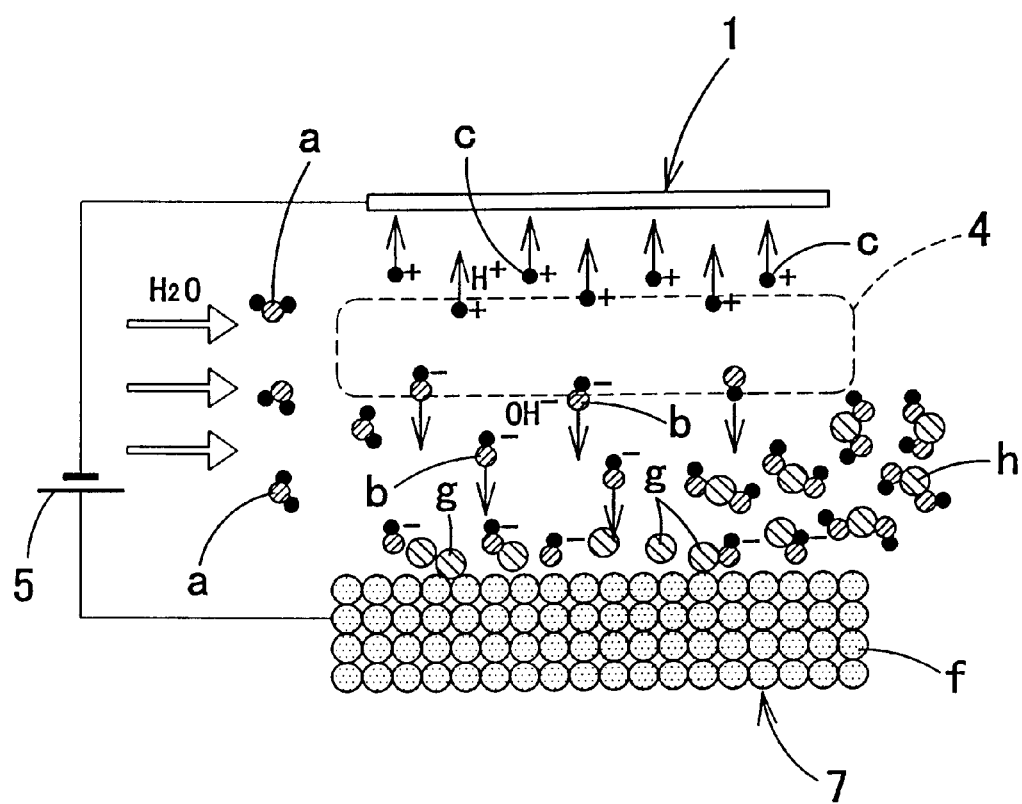
FIG. 20 is a concept diagram illustrating the washing principle in the second inventions.

The second invention will now be described. FIG. 20 illustrates the washing principle in the second invention. In this figure, 7 is the material to be washed, and the rest of the structure is exactly the same as -in the first invention. That is, the washing apparatus for implementing the washing method of the second invention is the same as the above-mentioned processing apparatus. Again in the second invention, the hydroxide ion density can be increased in ultra-pure water, and a material can be washed in an extremely clean environment, without adding any other solution. Most of what was described for the first invention can be directly applied to the second invention merely by replacing the workpiece 2 with an object to be washed 7.

The washing principle in the second invention is illustrated in FIG. 20, in which the basic structure is such that the ion exchange material 4 is disposed between the object to be washed 7 (which is disposed in the ultra-pure water and serves as the anode) and the cathode (the high pressure nozzle 1) provided facing the object to be washed 7, and the power supply 5 is connected between the object to be washed 7 and the cathode (high pressure nozzle 1). With this structure, the water molecules (a )in the ultra-pure water are decomposed into hydroxide ions b and hydrogen ions c by the ion exchange material 4, and the hydroxide ions thus produced are supplied to the surface of the object to be washed by the electrical field between the object to be washed 7 and the cathode (high pressure nozzle 1) and by the flow of the ultra-pure water sprayed from the high pressure nozzle 1, which raises the density of the hydroxide ions near the workpiece. The reaction substances h produced by the reaction between the hydroxide ions b and impurity metals g adhering to the object to be washed atoms f are eluted into the ultra-pure water, the bonds between the impurity metals g and the surface of the object to be washed are broken by the high-speed shear flow, and the shear flow of the ultra-pure water along the surface of the object to be washed 7 removes these reaction substances h from the surface of the object to be washed 7. If the impurity metals are in a positive ionic state, then it is possible to promote the stripping of the impurity metals from the surface of the object to be washed by using the object to be washed as the anode and utilizing an electrical repellent force.

It was next estimated how much shear flow strength (velocity gradient) would be needed on the surface of the object to be washed in order to remove the microparticles adhering to the surface of the object to be washed through chemical bonding. $ZrO_2$ microparticles with a diameter of 0.1 μm were adsorbed onto a silicon (100) surface in ultra-pure water, and an optical microscope was used to observe how the microparticles were removed from the surface when shear flows of ultra-pure water of various strength were allowed to act upon this surface. As a result, it was found that effective removal of the microparticles proceeds when the velocity gradient exceeds about 5 m/s·μm. This result revealed that a shear flow of at least a specific velocity gradient is necessary, but it is expected that the lower limit thereof will vary with the type of material being washed and the type and size of the adhering microparticles. It is possible, however, to reduce the required velocity gradient of the shear flow by using the high-speed shear flow produced by the high pressure nozzle 1 together with a means for increasing the hydroxide ion density produced by the above-mentioned ion exchange material 4, or a means for applying a voltage using the object to be washed as the anode.

Upon reaching the surface of the object to be washed 7, the ultra-pure water sprayed from the high pressure nozzle 1 flows as a high-speed shear flow along this surface. The hydroxide ions produced by the ion exchange material 4 are supplied to the surface of the object to be washed 7 by the electrical field between the high pressure nozzle 1 and the object to be washed 7 and by the flow of the ultra-pure water sprayed from the high pressure nozzle 1. As a result, the density of the hydroxide ions is raised near the surface of the object to be washed 7, these hydroxide ions react with the impurity metals adhering to the surface of the object to be washed and produce processing reaction substances, and any reaction substances still adhering to the surface of the object to be washed 7 or eluted in the ultra-pure water are removed from the surface by the high-speed shear flow of ultra-pure water as the washing proceeds. The ultra-pure water containing reaction substances produced through a reaction between the impurity metals and the hydroxide ions is recovered immediately and efficiently by a recovery plate 6 provided as the recovery means in FIG. 4. Also, just as above, any reaction substances produced by reaction with the impurity metals adhering to the surface of the object to be washed 7 are immediately removed from the surface by the shear flow of ultra-pure water sprayed from the high pressure nozzle 1, which prevents the re-adhesion of the reaction substances removed from the surface of the object to be washed.

With the second invention described above, a means for increasing the hydroxide ions produced by the ion exchange material 4, and a means for applying voltage using the object to be washed 7 as the anode were used in conjunction with a high-speed shear flow along the surface of the object to be washed 7 produced by spraying the ultra-pure water from the high pressure nozzle 1, but a washing method in which one of these means is eliminated can also be used depending on the washing objective, although the washing efficiency will drop.

As discussed above, with the methods for processing and washing with hydroxide ions in ultra-pure water of the present invention, processing and washing can be carried out in a completely clean environment using only ultra-pure water, so these methods can be utilized particularly well in processing on the atomic level for semiconductor wafers and so forth, and in the washing away of metal ions or metal microparticles stubbornly adhering to a surface. In other words, the present invention contributes in all industrial fields in which ultra-precise and ultra-clean materials are handled, such as in the semiconductor industrial field of manufacturing electronic devices of high reliability and extremely high integration.

What is claimed is:

1. A method for processing with hydroxide ions in ultra-pure water, comprising the steps of:

disposing a workpiece and a high pressure nozzle a specific distance apart from each other inside a washing tank containing only ultra-pure water;

providing an ion exchange material or catalyst material that increases the amount of hydroxide ions between the processing surface of said workpiece and the distal end of the high pressure nozzle facing said surface;

applying a voltage using the high pressure nozzle as the cathode and the workpiece as the anode;

generating a high-speed shear flow of ultra-pure water sprayed from the high pressure nozzle near the surface of the workpiece;

supplying hydroxide ions produced from the ultra-pure water to the workpiece surface; and subjecting the workpiece to removal processing or to oxide film formation processing by means of a chemical elution reaction or oxidation reaction brought about by the hydroxide ions.

2. The method for processing with hydroxide ions according to claim 1, wherein spray opening in the high pressure nozzle is a round hole.

3. The method for processing with hydroxide ions according to claim 1, wherein spray opening in the high pressure nozzle is a slit.

4. The method for processing with hydroxide ions according to claim 1, 2, or 3, wherein recovery means is provided on the downstream side of the high-speed shear flow generated by the high pressure nozzle, for recovering any process reaction substances removed from the workpiece.

5. A method for washing with hydroxide ions in ultra-pure water, comprising the steps of:

disposing an object to be washed and a high pressure nozzle a specific distance apart from each other inside a washing tank containing only ultra-pure water;

providing an ion exchange material or catalyst material that increases the amount of hydroxide ions between the processing surface of said object to be washed and the distal end of the high pressure nozzle facing said surface;

generating a high-speed shear flow of ultra-pure water sprayed from the high pressure nozzle near the surface of the object to be washed;

supplying hydroxide ions produced from the ultra-pure water to the surface of the object to be washed;

stripping from the surface of the object to be washed any fine impurity metals adhering to the surface thereof by means of the high-speed shear flow and a chemical elution reaction with hydroxide ions; and using the high-speed shear flow to prevent the impurity metals thus removed from re-adhering to the surface of the object to be washed.

6. The method for washing with hydroxide ions according to claim 5, wherein spray opening in the high pressure nozzle is a round hole.

7. The method for washing with hydroxide ions according to claim 5, wherein spray opening in the high pressure nozzle is a slit.

8. The method for washing with hydroxide ions according to claim 5, 6, or 7, wherein recovery means is provided on the downstream side of the high-speed shear flow generated by the high pressure nozzle, for recovering any process reaction substances removed from the object to be washed.

9. A method for washing with hydroxide ions in ultra-pure water, comprising the steps of:

disposing an object to be washed and a high pressure nozzle a specific distance apart from each other inside a washing tank containing only ultra-pure water;

applying a voltage using the high pressure nozzle as the cathode and the object to be washed as the anode;

generating a high-speed shear flow of ultra-pure water sprayed from the high pressure nozzle near the surface of the object to be washed;

supplying hydroxide ions produced from the ultra-pure water to the surface of the object to be washed;

stripping from the surface of the object to be washed any fine impurity metals adhering to the surface thereof by means of the high-speed shear flow and a chemical elution reaction with hydroxide ions; and using the high-speed shear flow to prevent the impurity metals thus removed from re-adhering to the surface of the object to be washed.

10. The method for washing with hydroxide ions according to claim 9, wherein spray opening in the high pressure nozzle is a round hole.

11. The method for washing with hydroxide ions according to claim 9, wherein spray opening in the high pressure nozzle is a slit.

12. The method for washing with hydroxide ions according to claim 9, 10, or 11, wherein recovery means is provided on the downstream side of the high-speed shear flow generated by the high pressure nozzle, for recovering any process reaction substances removed from the object to be washed.

13. A method for washing with hydroxide ions in ultra-pure water, comprising the steps of:

disposing an object to be washed and a high pressure nozzle a specific distance apart from each other inside a washing tank containing only ultra-pure water;

providing an ion exchange material or catalyst material that increases the amount of hydroxide ions between the processing surface of said object to be washed and the distal end of the high pressure nozzle facing said surface;

applying a voltage using the high pressure nozzle as the cathode and the object to be washed as the anode;

generating a high-speed shear flow of ultra-pure water sprayed from the high pressure nozzle near the surface of the object to be washed;

supplying hydroxide ions produced from the ultra-pure water to the surface of the object to be washed;

stripping from the workpiece surface any fine impurity metals adhering to the surface of the object to be washed by means of the high-speed shear flow and a chemical elution reaction with hydroxide ions; and using the high-speed shear flow to prevent the impurity metals thus removed from re-adhering to the surface of the object to be washed.

14. The method for washing with hydroxide ions according to claim 13, wherein spray opening in the high pressure nozzle is a round hole.

15. The method for washing with hydroxide ions according to claim 13, wherein spray opening in the high pressure nozzle is a slit.

16. The method for washing with hydroxide ions according to claim 13, 14, or 15, wherein recovery means is provided on the downstream side of the high-speed shear flow generated by the high pressure nozzle, for recovering any process reaction substances removed from the object to be washed.

* * * * *